(12) United States Patent
Tamaki

(10) Patent No.: US 8,018,048 B2
(45) Date of Patent: Sep. 13, 2011

(54) SEMICONDUCTOR DEVICE

(75) Inventor: Kazuo Tamaki, Kitakatsuragi-gun (JP)

(73) Assignee: Sharp Kabushiki Kaisha, Osaka-Shi, Osaka (JP)

( * ) Notice: Subject to any disclaimer, the term of this patent is extended or adjusted under 35 U.S.C. 154(b) by 466 days.

(21) Appl. No.: 12/076,389

(22) Filed: Mar. 18, 2008

(65) Prior Publication Data
US 2008/0237838 A1 Oct. 2, 2008

(30) Foreign Application Priority Data

Mar. 29, 2007 (JP) ................................ 2007-089688

(51) Int. Cl.
*H01L 23/14* (2006.01)
(52) U.S. Cl. ............ 257/702; 257/77; 257/70; 257/737
(58) Field of Classification Search .......... 257/777–778, 257/E27.137, E27.144, E27.161; 438/108
See application file for complete search history.

(56) References Cited

U.S. PATENT DOCUMENTS

| | | | |
|---|---|---|---|
| 5,451,814 A | | 9/1995 | Yoshimizu |
| 6,392,143 B1 * | | 5/2002 | Koshio ........................ 174/528 |
| 6,513,236 B2 * | | 2/2003 | Tsukamoto .................... 29/846 |
| 2001/0020736 A1 * | | 9/2001 | Nakazawa et al. ............ 257/678 |
| 2002/0145204 A1 | | 10/2002 | Naka et al. |
| 2005/0029673 A1 | | 2/2005 | Naka et al. |
| 2005/0189634 A1 | | 9/2005 | Wakiyama et al. |
| 2005/0275112 A1 * | | 12/2005 | Schaffer ........................ 257/777 |

FOREIGN PATENT DOCUMENTS

| | | |
|---|---|---|
| JP | 2000-196008 A | 7/2000 |
| JP | 2002-196008 A | 7/2000 |
| JP | 2002-305285 A | 10/2002 |
| JP | 2005-251784 A | 9/2005 |

\* cited by examiner

*Primary Examiner* — Marcos D Pizarro Crespo
*Assistant Examiner* — Sue Tang
(74) *Attorney, Agent, or Firm* — Nixon & Vanderhye P.C.

(57) ABSTRACT

The semiconductor device includes a plurality of semiconductor chips, and a circuit substrate having a substantially rectangular outer shape. The semiconductor device is an MCM having an MCM packaging structure in which the plurality of semiconductor chips are juxtaposed on the semiconductor chip mounting surface of the circuit substrate, and the semiconductor chip mounting surface is covered by a sealing resin along an outer edge of the circuit substrate so that the plurality of semiconductor chips are sealed. The thickness of the semiconductor chip to be mounted so as to traverse a center line has a thicker thickness in a direction perpendicular to the semiconductor chip mounting surface than the thickness of any of the other semiconductor chips which is mounted on the semiconductor chip mounting surface, the center line being defined an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface. This enables to suppress the warpage generated in the semiconductor device, and to reduce inadequate connection occurred due to the warpage in the semiconductor device.

36 Claims, 10 Drawing Sheets

SEMICONDUCTOR DEVICE

This Nonprovisional application claims priority under 35 U.S.C. §119(a) on Patent Application No. 089688/2007 filed in Japan on Mar. 29, 2007, the entire contents of which are hereby incorporated by reference.

FIELD OF THE TECHNOLOGY

The present technology relates to a semiconductor device referred to as an MCM (Multi Chip Module). The present technology particularly relates to a packaging structure in which a plurality of semiconductor chips are mounted so as to be juxtaposed in a thin packaging covered with a sealing resin.

BACKGROUND OF THE TECHNOLOGY

In resent years, high density mounting of semiconductor devices is in need for, due to the multiple functioning, downsizing, weight reduction and reduction in the thickness of portable information devices. Consequently, an MCM structure is proposed in order to meet these demands. The MCM realizes one package in which a plurality of semiconductor devices are mounted.

An example of a semiconductor device having the MCM structure is disclosed in Japanese Unexamined Patent Publication, Tokukaihei, No. 6-89962 (published on Mar. 29, 1994). FIG. 15 is a plan view illustrating the structure of a conventional semiconductor device 100, and shows the state which has not been subjected to sealing with a resin. FIG. 16 is a side sectional view of the conventional semiconductor device 100, which has been subjected to the sealing with the resin, taken along line E-E in FIG. 15.

The semiconductor device 100 includes two semiconductor chips 101, which are juxtaposed. The two semiconductor chips 101 are directly mounted on tabs 102, respectively, and the tabs 102 are linked together by a tab joining section 103. Each of the semiconductor chips 101 receives and outputs a signal, by being wire bonded with a lead 104 via a bonding wire 105. In addition, a sealing resin 106 seals the two semiconductor chips 101 and the bonding wire 105.

By thus packing the semiconductor device including an MCM structure (MCM packaging), it is not necessary for one semiconductor device (SoC (System on Chip)) to be integrated so as to have a plurality of functions. As such, it is advantageous to cost and yield rate of fabrication of the semiconductor device.

In addition, when comparing a case where a plurality of semiconductor chips, each having a respective function, are separately packaged with a case where a plurality of semiconductor chips, each having a respective function, are MCM-packaged, the latter case can have less mounting area than the former, when mounting the semiconductor chips.

However, the conventional semiconductor device 100 has the following problem. A warpage is readily generated, if the semiconductor device 100 is of a slim package with a high aspect ratio. The aspect ratio is a ratio indicated by X/Y, where X and Y are a long side and a short side, respectively, of a two-dimensional shape.

FIG. 17 is a view illustrating a warpage which is generated in an MCM-packaged semiconductor device 110. As illustrated in FIG. 17, a warpage W1 is generated in a direction perpendicular to the mounting surface on each end part of the semiconductor device 110, when the mounting surface of the semiconductor device 110 has a size of X×Y. In addition, a bending point P emerges due to this warpage.

FIG. 18 is a view illustrating a warpage generated in a semiconductor device 120, which is of a larger size than that of the semiconductor device 110 in FIG. 17. As illustrated in FIG. 18, a warpage W2 is generated in a direction perpendicular to the mounting surface on each end part of the semiconductor device 120, when the mounting size of the semiconductor device 120 has a size of 2X×Y. In addition, a bending point P emerges due to this warpage, as similar to the semiconductor device 110.

If the semiconductor device 110 in FIG. 17 and the semiconductor device 120 in FIG. 18 warp with the same curvature, the warpage W2 of the semiconductor device 120 in FIG. 18 with a higher aspect ratio will be greater than the warpage W1 of the semiconductor device 110 in FIG. 17 (W1<W2). That is to say, the warpage greatens with a higher aspect ratio, even if the curvature is the same.

However, there is a high demand for extremely thin packages, particularly from the reduction in the thickness of portable devices itself. Thus, solving the problem of warping is demanded even more.

The following two points appear to be the cause for the warpage which is generated in the MCM-packaged semiconductor device.

The first cause is that the MCM-packaged semiconductor device tends to warp concavely as a whole from the cure shrinkage of a sealing resin. Particularly, in case of a slim semiconductor device, the cure shrinkage force of the resin is greater than the rigidity of the semiconductor device. Thus, a large concave warpage occurs. In contrast, if a resin with a lower cure shrinkage force is used, a convex warpage is generated as in an MCM-packaged semiconductor device 130, as illustrated in FIG. 19.

The second cause is that the bending point of the warpage tends to be generated particularly in an area between the semiconductor chips which are juxtaposed, as illustrated in FIG. 20. FIG. 20 is a view illustrating bending points P which emerge when a warpage is generated, in a semiconductor device 140 in which three semiconductor chips 141, 142 and 143 are juxtaposed. The bending points P emerge between the semiconductor chips 141 and 142, and between the semiconductor chip 141 and 143, respectively. The warpage W3 generates at each end part of the semiconductor device 140. The warpage starts to bend from the bending points P.

The trend of the second cause appears to be based on the fact that no semiconductor chip exists. It appears that the warpage is generated from the following reasons: (i) since the area with no semiconductor chip has a great amount of resin, a great amount of cure shrinkage occurs; and (ii) the rigidity is also insufficient since there is no semiconductor chip. In addition, a warpage (W4) at the end part of a semiconductor device 150 becomes greater as the bending points P are closer to the center of the semiconductor device 150, as illustrated in FIG. 21. Specifically, the warpage for the semiconductor device 150 satisfies W3<W4.

The generation of a large warpage is likely to cause inadequate mounting. That is, a problem of inadequate connection occurs when mounting the semiconductor device to a substrate or the like, if the warpage becomes greater.

For example, in FIG. 18, the semiconductor device 120 is mounted on a mounting substrate 125, while positioning of solder balls 121 supplied to the external terminal of the semiconductor device 120 with respect to a connection pad 126 supplied with a solder paste 127 on the mounting substrate 125. If the warpage is great in the semiconductor device 120, the solder paste 127 and the solder balls 121 cannot come into contact with each other. There is a high possibility that inadequate connection would occur if the solder is melted by a reflow furnace in this state.

SUMMARY OF THE TECHNOLOGY

The present technology is made in view of the aforementioned conventional problems, and an object thereof is to provide a semiconductor device having an MCM-packaged structure, which can withhold from a generation of warp in the semiconductor device, and which reduces the occurrence of inadequate connection due to the warpage in the semiconductor device.

In order to solve the problems, the semiconductor device includes an MCM packaging structure, the MCM packaging structure including: a plurality of semiconductor chips; and a circuit substrate having a substantially rectangular outer shape, wherein: the plurality of semiconductor chips are juxtaposed on a semiconductor chip mounting surface of the circuit substrate, on which mounting surface the plurality of semiconductor chips are mounted, and the semiconductor chip mounting surface is covered with a sealing resin along an outer edge of the circuit substrate so that the plurality of semiconductor chips are sealed, wherein a semiconductor chip of the plurality of semiconductor chips which is mounted so as to traverse a center line has a thicker thickness in a direction perpendicular to the semiconductor chip mounting surface than a thickness, in the direction, of any of the other semiconductor chips of the plurality of semiconductor chips, said center line being defined an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface.

According to the arrangement, the semiconductor chip to be mounted so as to traverse the center line has a thicker thickness in a direction perpendicular to the semiconductor chip mounting surface than the thickness of any of the other semiconductor chips which is mounted on the semiconductor chip mounting surface. This allows an increase in the rigidity of the semiconductor device, thereby enabling to suppress the warpage which will be generated in the semiconductor device.

In addition, the semiconductor device is mounted to other components such as a mounting substrate. In this regard, if a warpage is generated in the semiconductor device, the semiconductor device will not come into contact with the mounting surface when mounted on the other components. This causes the possibility of an inadequate connection to increase. On the other hand, since the semiconductor device allows the suppression of the warpage, it is possible to reduce inadequate connection occurred due to the warpage in the semiconductor device.

In addition, the semiconductor device includes an MCM packaging structure, the MCM packaging structure including: at least three semiconductor chips; and a circuit substrate having a substantially rectangular outer shape, wherein: the at least three semiconductors chips, each alone or stacked, are juxtaposed on a semiconductor chip mounting surface of the circuit substrate, on which mounting surface the at least three semiconductor chips are mounted, and the semiconductor chip mounting surface is covered with a sealing resin along an outer edge of the circuit substrate so that the at least three semiconductor chips are sealed, wherein a semiconductor chip of the at least three semiconductor chips which is mounted, alone or stacked, so as to traverse a center line has an overall thicker thickness in a direction perpendicular to the semiconductor mounting surface than a thickness, in the direction, of any of the other semiconductor chips of the at least three semiconductor chips, each of which is mounted alone or stacked, the center line being defined by an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface.

According to the arrangement, the semiconductor chip to be mounted, alone or stacked, so as to traverse the center line has a thicker overall thickness in a direction perpendicular to the semiconductor chip mounting surface than the overall thickness of any of the other semiconductor chips which is mounted, alone or stacked, on the semiconductor chip mounting surface. This allows the increase in the rigidity of the semiconductor device, thereby enabling to suppress the warpage which will be generated in the semiconductor device.

In addition, mounting of a plurality of semiconductor chips on the circuit substrate in a stacked state allows the mounting of the plurality of semiconductor chips within a limited size of the semiconductor chip mounting surface on the circuit substrate. This allows the semiconductor device to possess multiple functions.

Furthermore, the semiconductor device is mounted to other components such as a mounting substrate. In this regard, if a warpage is generated in the semiconductor device, the semiconductor device will not come into contact with the mounting surface when mounted on the other components. This causes the possibility of an inadequate connection to increase. On the other hand, since the semiconductor device allows the suppression of the warpage, it is possible to reduce inadequate connection occurred due to the warpage in the semiconductor device.

In addition, the semiconductor device includes an MCM packaging structure, the MCM packaging structure including: a plurality of semiconductor chips; and a circuit substrate having a substantially rectangular outer shape, wherein: the plurality of semiconductor chips, each alone or stacked, are juxtaposed on a semiconductor chip mounting surface of the circuit substrate, on which mounting surface the plurality of semiconductor chips are mounted, and the semiconductor chip mounting surface is covered with a sealing resin along an outer edge of the circuit substrate so that the plurality of semiconductor chips are sealed, wherein a warpage prevention member is stacked on a semiconductor chip of the plurality of semiconductor chips which is mounted, alone or stacked, so as to traverse a center line, the center line being defined by an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface, and a total thickness, indicative of a sum of a thickness of the semiconductor chip and a thickness of the warpage prevention member each in a direction perpendicular to the semiconductor chip mounting surface, is thicker than a thickness, in the direction, of any of the other semiconductor chips of the plurality of semiconductor chips which are mounted, alone or stacked, on the semiconductor chip mounting surface.

According to the arrangement, the total thickness of a semiconductor chip on which a warp prevention member is stacked, to be mounted, alone or stacked, so as to traverse the center line is thicker than the overall thickness of any of the other semiconductor chips which is mounted, alone or stacked on the semiconductor chip mounting surface. The total thickness of the semiconductor chip indicates the thickness of the sum of the overall thickness of the semiconductor chip and the thickness of the warp prevention member. This allows the increase in the rigidity of the semiconductor device, thereby enabling to further suppress the warpage which will be generated in the semiconductor device.

In addition, mounting of the warp prevention member on the semiconductor chip to be mounted, alone or stacked, so as to traverse the center line allows the semiconductor device to achieve the effect to suppress the warpage, and allows the semiconductor device to possess a different feature (for example, heat radiating property, electromagnetic shielding property, insulation property or the like) than the function of the semiconductor chip.

Furthermore, the semiconductor device is mounted to other components such as a mounting substrate. In this regard, if a warpage is generated in the semiconductor device, the semiconductor device will not come into contact with the mounting surface when mounted on the other components. This causes the possibility of an inadequate connection to increase. On the other hand, since the semiconductor device allows the suppression of the warpage, it is possible to reduce inadequate connection occurred due to the warpage in the semiconductor device.

In addition, the semiconductor device including an MCM packaging structure includes: a plurality of semiconductor chips; and a circuit substrate having a substantially rectangular outer shape, wherein: the plurality of semiconductor chips are juxtaposed on a semiconductor chip mounting surface of the circuit substrate, on which mounting surface the plurality of semiconductor chips are mounted, and the semiconductor chip mounting surface is covered with a sealing resin along an outer edge of the circuit substrate so that the plurality of semiconductor chips are sealed, wherein the semiconductor chip mounting surface is partitioned in its longitudinal direction so as to have three partitions, each having a same length, no bending point appearing in a partition of the three partitions which includes a center line, the center line being defined by an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface.

According to the arrangement, the bending point is located outside the partition which includes the center line, and so a warpage generated in the semiconductor device is suppressed, as compared to an arrangement in which a bending point emerges near the center line.

In addition, the semiconductor device is mounted to other components such as a mounting substrate. In this regard, if a warpage is generated in the semiconductor device, the semiconductor device will not come into contact with the mounting surface when mounted on the other components. This causes the possibility of an inadequate connection to increase. On the other hand, since the semiconductor device allows the suppression of the warpage, it is possible to reduce inadequate connection occurred due to the warpage in the semiconductor device.

Additional objects, features, and strengths of the present technology will be made clear by the description below. Further, the advantages of the present technology will be evident from the following explanation in reference to the drawings.

DESCRIPTION OF THE EMBODIMENTS

The technology relates to a semiconductor device referred to as an MCM (Multi Chip Module). The following description deals with several embodiments of the MCM with reference to drawings.

First Embodiment

Below is an explanation of one embodiment referring to drawings.

Figure 1:
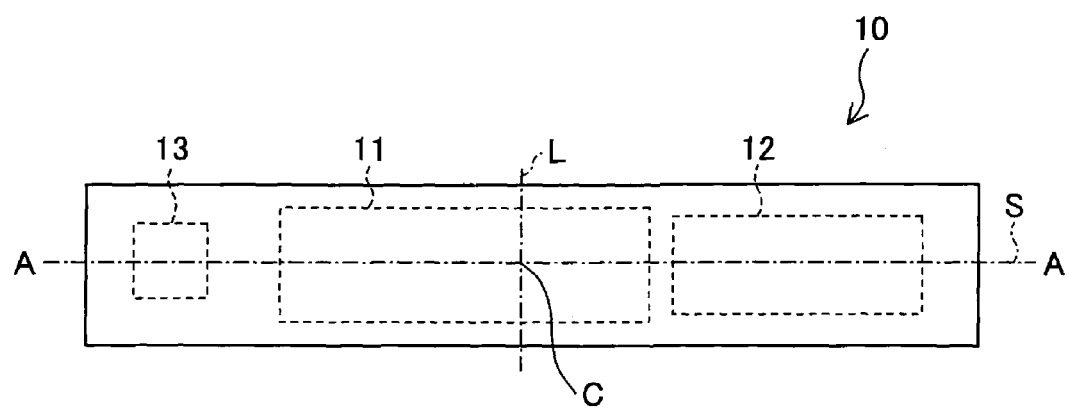
FIG. 1(a) is a plan view illustrating one embodiment of a semiconductor device.
FIG. 1(b) is a side sectional view of the semiconductor device in FIG. 1(a), taken along line A-A in FIG. 1(a).
Figure 1:
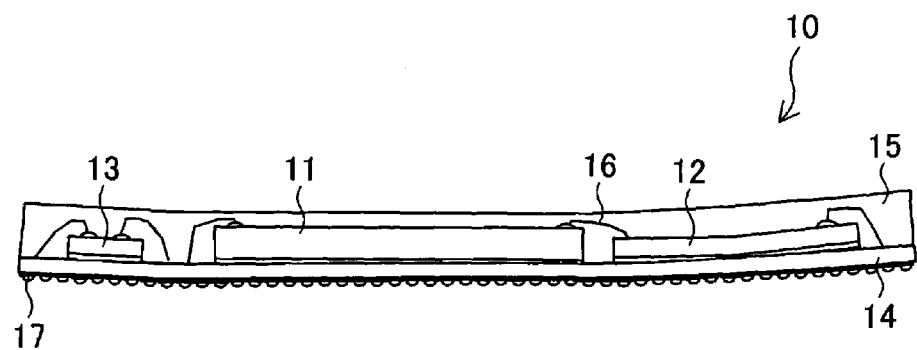

FIG. 1(a) is a plan view of an MCM 10 viewed from a resin sealing surface side, in the direction perpendicular to the mounting surface of semiconductor chips 11, 12, and 13 on a circuit substrate 14. FIG. 1(b) is a side sectional view of the MCM 10 in FIG. 1(a) taken along the line A-A. The line A-A of FIG. 1(a) passes through a center line C of the MCM 10. FIG. 1(b) illustrates the cross section passing through the center line C of the MCM 10.

The resin sealing surface side indicates the side (top side of FIG. 1(b)) on which side the semiconductor chips 11, 12, and 13 mounted on the circuit substrate 14 are sealed with a sealing resin 15. The opposite side of the resin sealing surface side of the circuit substrate 14 indicates an external connection surface side (bottom side of FIG. 1(b)).

The MCM 10 of the present embodiment includes the semiconductor chips 11, 12 and 13, the circuit substrate 14, and the sealing resin 15, as illustrated in FIGS. 1(a) and 1(b).

The semiconductor chips 11, 12 and 13 are bare semiconductor chips, each of which is integrated to have its function. The semiconductor chips 11, 12 and 13 are mounted on the circuit substrate 14 so as to be juxtaposed (so as not to overlap). The semiconductor chip 11 and 12 are wire bonded via a bonding wire 16. The circuit substrate 14 and a respective of the semiconductors 11, 12 and 13 are wire bonded, via a bonding wire 16. This ensures the provision of signal input and output paths for the semiconductors 11, 12 and 13, respectively. The size, the thickness, and the arrangement of each of the semiconductor chips 11, 12 and 13 are later described in detail.

The circuit substrate 14 is a thin-sheet wiring substrate with a substantially rectangular outer shape. The circuit substrate 14 has external terminals 17, on the external connection surface side, via which other components can be connected. Each of the external terminals 17 is electrically connected to the wiring. This allows inputting/outputting of an electric signal to be carried out between the external terminal 17 and a respective of the semiconductor chips 11, 12 and 13. Solder is used for the external terminal 17. The number of the external terminals 17 is determined in accordance with the design.

The sealing resin 15 is a resin for sealing the semiconductor chips 11, 12 and 13, and the bonding wire 16. Specifically, the sealing resin 15 seals the semiconductor chips 11 through 13 and the bonding wire 16 on the resin sealing surface side so as to cover the semiconductor chips 11 through 13 and the bonding wire 16. This causes the sealing resin 15 to have a slim substantially rectangular parallelepiped shape along the outer edge of the circuit substrate 14.

Thus, the MCM 10 is in a slim substantially rectangular parallelepiped shape, while the circuit substrate 14, the sealing resin 15 and the external terminals 17 are exposed.

The following description deals in detail with the arrangement of the semiconductor chips 11, 12 and 13.

The MCM 10 has a center line C, as illustrated in FIG. 1(a). The center line C is defined by an intersection of a longitudinal cross section L and a transverse cross section S. The longitudinal cross section L halves the mounting surface of the semiconductor chips 11, 12 and (semiconductor chip mounting surface) in a longitudinal direction (the lateral direction in FIG. 1(a)) and the transverse cross section S halves the semiconductor chip mounting surface in the transverse direction (the vertical direction in FIG. 1(a)). That is to say, the center line C indicates a virtual line passing through the center of the MCM 10, which virtual line is perpendicular to the semiconductor chip mounting surface of the circuit substrate 14.

In the embodiment, the semiconductor chip 11 is arranged to traverse the center line C in the MCM 10. On both sides of the semiconductor chip 11, the semiconductor chips 12 and 13 are so arranged that the semiconductors 11 through 13 form a line.

The semiconductor chips 11, 12 and 13 are arranged so that: (i) a thickness in the direction perpendicular to the semiconductor chip mounting surface satisfies the inequality "semiconductor chip 11>semiconductor chip 12=semiconductor chip 13", and (ii) a surface size (area) of the semiconductor chip mounted facing the semiconductor chip mounting surface satisfies the inequality "semiconductor chip 11>semiconductor chip 12>semiconductor chip 13".

As such, the MCM 10 has a thicker thickness of the semiconductor chip 11 to be mounted so as to traverse the center line C of the MCM 10 than the thickness of each of the other semiconductor chips 12 and 13. This allows an increase in the rigidity of the MCM 10, thereby enabling to suppress the warpage which will be generated in the MCM 10.

That is to say, the size and thickness of each semiconductor chip to be mounted in the MCM may be the same or different, as long as the semiconductor chips are arranged such that the thickness of the semiconductor to be mounted so as to traverse the center line C of the MCM has a thicker thickness than the other semiconductor chips.

The MCM 10 is mounted to an external component such as a mounting substrate, via the external terminals 17 which serves as the connection section. In this regard, if a warpage is generated in the MCM 10, the external terminals 17 will not come into contact with a joining section of the mounting substrate. This causes the possibility of an inadequate connection to increase.

On the other hand, since the MCM 10 of the present embodiment allows the suppression of the warpage, it is possible to reduce inadequate connection occurred due to the warpage in the MCM 10.

In addition, in the MCM 10, the outer shape size of the semiconductor chip 11 to be mounted so as to traverse the center line C is larger than that of each of the other semiconductor chips 12 and 13. This allows a further increase in the rigidity of the MCM 10, thereby enabling to further suppress the warpage which will be generated in the MCM 10.

In addition, an arrangement is preferable in which the thickness of the circuit substrate 14 is thinner (smaller) than the thickness of the semiconductor chip 11, so as to further enhance the warpage suppression effect. Note that the thickness of the circuit substrate 14 indicates the thickness of the circuit substrate 14 in a direction perpendicular to the semiconductor chip mounting surface. This allows an increase in the relative rigidity of the semiconductor chip 11 with respect to the circuit substrate 14, thereby enabling to further enhance the warpage suppression effect.

For example, Table 1 shows a result of an experiment in warpage generation, while the circuit substrate 14 had a fixed thickness and the semiconductor chip 11 had a varying thickness.

TABLE 1

| Thickness of Semiconductor Chip 11 (μm) | Thickness of Circuit Substrate 14 (μm) | Warpage Ave (absolute value) |
| --- | --- | --- |
| 125 | 100 | 72.4 |
| 100 | | 96.2 |

The warpage generated in the MCM 10 was an average of 96.2 (absolute value), when the semiconductor chip 11 had a thickness of 100 (μm) and the circuit substrate 14 had a thickness of 100 (μm). In comparison, the warpage generated in the MCM 10 was an average of 72.4 (absolute value), when the semiconductor chip 11 had a thickness of 125 (μm) and the circuit substrate 14 had a thickness of 100 (μm).

Figure 19:
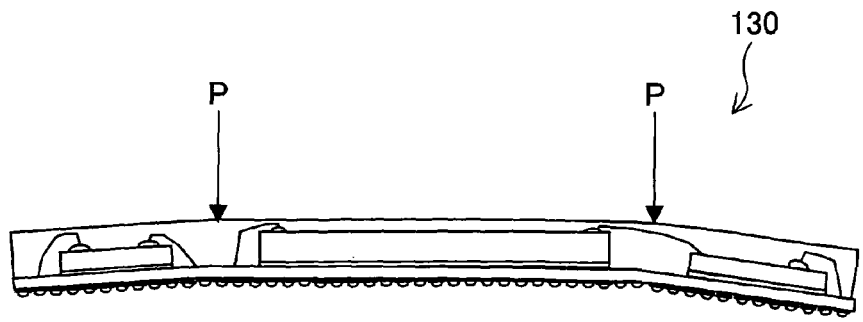
FIG. 19 is a sectional side view illustrating the conventional MCM-packaged semiconductor device with a convex warpage being generated.
Figure 20:
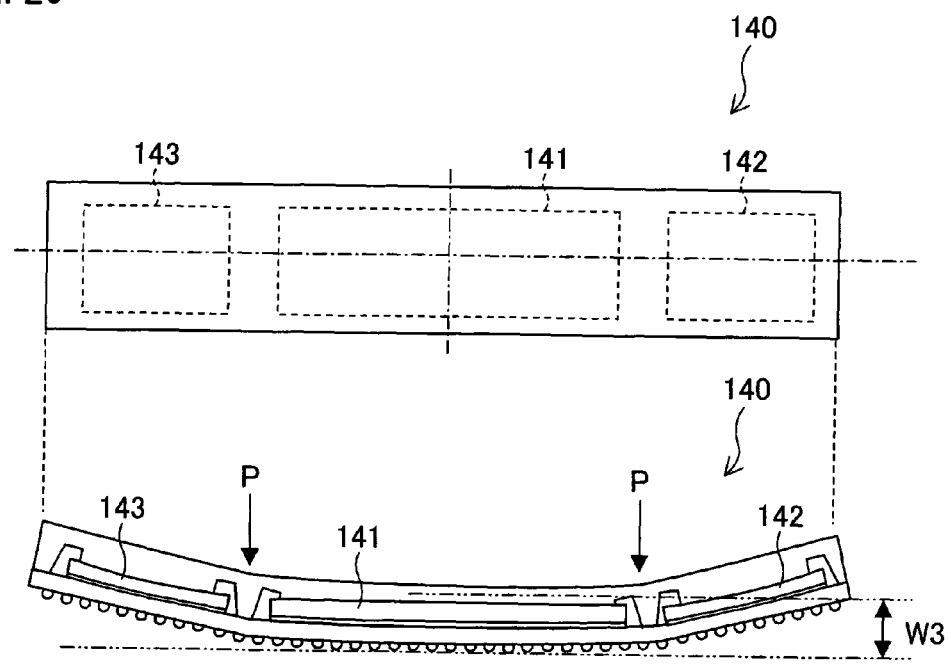
FIG. 20 is a view for explaining a bending point in the conventional MCM-packaged semiconductor device, which emerges when a warpage generates.
Figure 21:
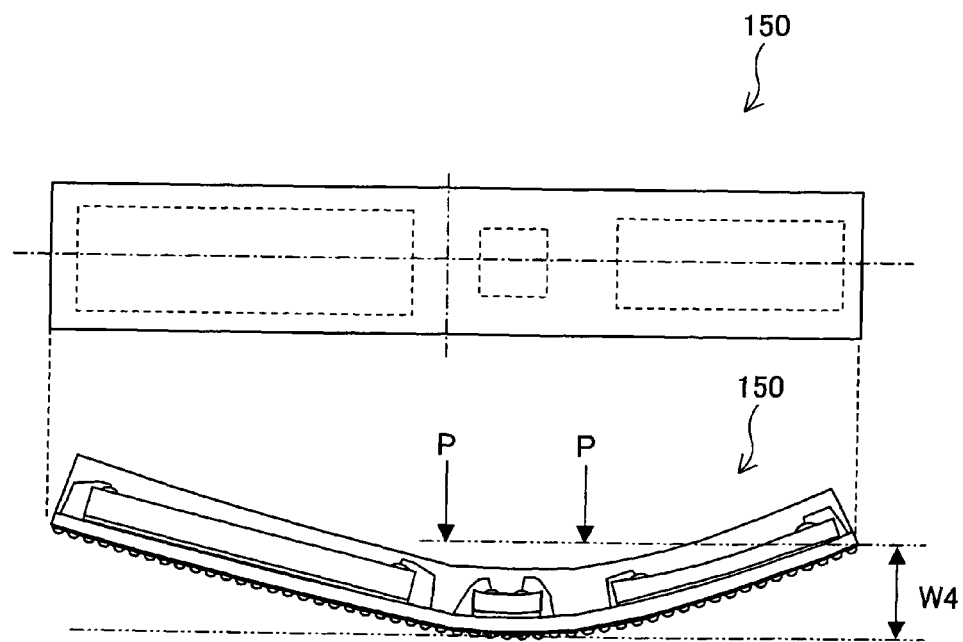
FIG. 21 is a view illustrating the conventional MCM-packaged semiconductor device, in a case where a bending point emerges near the center part of the semiconductor device.

As such, the effect is confirmed such that when the circuit substrate 14 had the thickness thinner than the thickness of the semiconductor chip 11, the warpage was reduced by approximately 24 (μm) in an average value. Note that it is possible to achieve the effect to reduce the warpage not only for a concave warp as illustrated in FIGS. 1(a) and 1(b), but also for a convex warp as illustrated in FIG. 19.

In addition, it is preferable for the semiconductor chip 11 to have a thickness thicker than half the thickness of the sealing resin 15. This allows the warpage suppression effect to be further enhanced. Note that the thickness of the sealing resin 15 indicates the thickness of the sealing resin 15 in a direction perpendicular to the semiconductor chip mounting surface of the circuit substrate 14.

For example, Table 2 shows a result of an experiment in warpage generation, while the sealing resin 15 had a fixed thickness, and the semiconductor chip 11 had a varying thickness, in the MCM 10.

TABLE 2

| Thickness of Semiconductor Chip 11 (μm) | Thickness of Sealing Resin 15 (μm) | Warpage | |
| --- | --- | --- | --- |
| | | Max (absolute value) | Ave (absolute value) |
| 150 | 300 | 62.6 | 52.8 |
| 100 | | 107.6 | 62.9 |

The warpage generated in the MCM 10 was 107.6 (absolute value) at the maximum and 62.9 (absolute value) in average, when the semiconductor chip 11 had a thickness of 100 (μm) and the sealing resin 15 had a thickness of 300 (μm). In comparison, the warpage generated in the MCM 10 was 62.6 (absolute value) at the maximum and 52.8 (absolute value) in average, when the semiconductor 11 had a thickness of 150 (μm) and the sealing resin 15 had a thickness of 300 (μm).

As such, the effect is confirmed such that the warpage was reduced by approximately 10 (μm) in average value and 45 (μm) in maximum value, when the semiconductor chip 11 had a thickness of half the thickness of the sealing resin 15. It is also possible to achieve the effect to reduce the warpage not only for the concave warp as illustrated in FIGS. 1(a) and 1(b) but also for the convex warp as illustrated in FIG. 19.

The warpage suppression effect of each of the arrangements appears remarkably especially in a case where the MCM 10 has a packaging structure in which an aspect ratio is 4 or over and an MCM 10 has a total thickness of not more than 600 (μm). The total thickness indicates a sum of the thickness of the circuit substrate 14 and the thickness of the sealing resin 15.

The aspect ratio is a ratio indicated by X/Y, where X and Y are a long side and a short side, respectively, of a two-dimensional shape. Thus, with reference to FIG. 1(a), the longitudinal direction (lateral direction in FIG. 1(a)) is X, and the transverse direction (vertical direction in FIG. 1(a)) is Y. The packaging structure of the MCM 10 is formed along the outer edge of the circuit substrate 14. As such, it is possible to regard the long side and the short side of the outer shape of the circuit substrate 14 as X and Y, respectively.

In order to verify the effect, the warpage was measured using the MCM 10 which has an aspect ratio of 4.52 or 4.62 and which has a total thickness of 400 (μm), the total thickness indicating a sum of the thickness of the circuit substrate 14 and the thickness of the sealing resin 15.

Figure 2:
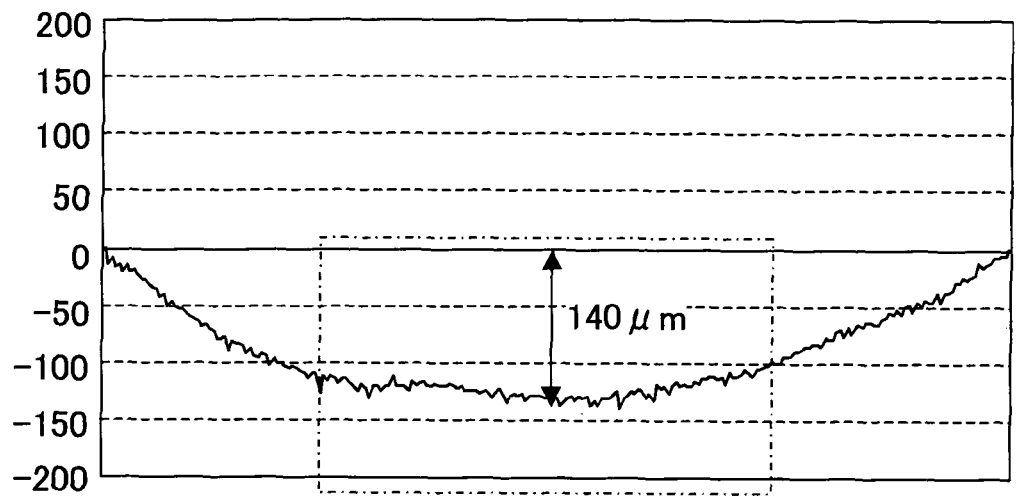
FIG. 2(a) is a graph illustrating a measurement result of a warpage which generates in the semiconductor device.
FIG. 2(b) is a close-up of one part of the graph in FIG. 2(a).
Figure 2:
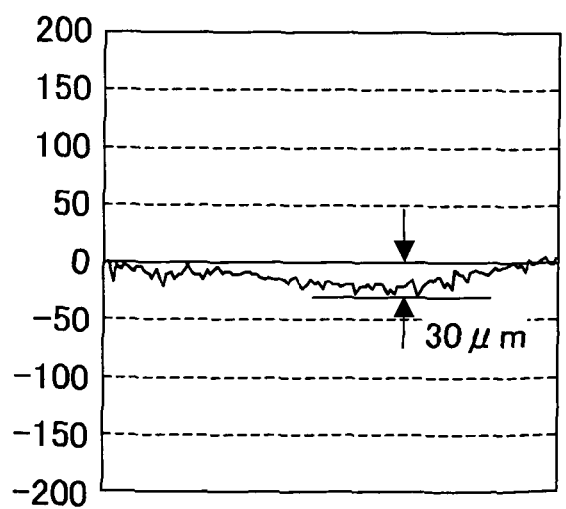

FIG. 2(a) is a graph showing a measured result of warpage when the MCM 10 had an aspect ratio of 4.62 and a thickness of 400 (μm). The vertical axis shows the warpage (μm), and the horizontal axis shows the distance on the line A-A in FIG. 1.

As illustrated in FIG. 2(a), a warpage of approximately 140 (μm) was generated in the MCM 10. FIG. 2(b) shows an estimated result when the MCM 10 is assumed to have an aspect ratio of 2.31 in a range of the central part (the part surrounded by the one-dot chain line) of the graph shown in FIG. 2(a).

In this case, as illustrated in FIG. 2(b), the MCM 10 has a warpage of approximately 30 (μm). Because of the small aspect ratio, the MCM 10 has a small warpage. Thus, this MCM 10 has, by nature low possibility of inadequate connection.

As such, the greater aspect an MCM has, the more remarkably the effect is achieved, i.e., the more effect of preventing the occurrence of inadequate connection the MCM achieves. Therefore, it is possible for the warpage suppression effect to be more effectively achieved in the case of a packaging structure in which the MCM 10 has an aspect ratio of 4 or more and has a total thickness of not more than 600 (μm), the total thickness indicating the sum of the thickness of the circuit substrate 14 and the thickness of the sealing resin 15.

Figure 3:
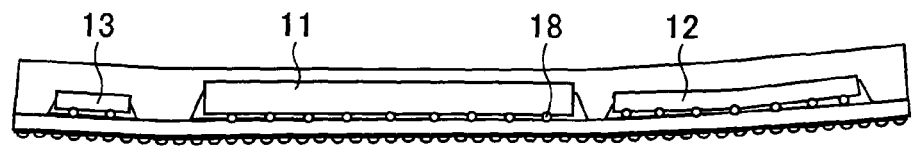
FIG. 3 is a side sectional view illustrating another arrangement example of a connection of a semiconductor chip and a circuit substrate in the semiconductor device.
Figure 4:
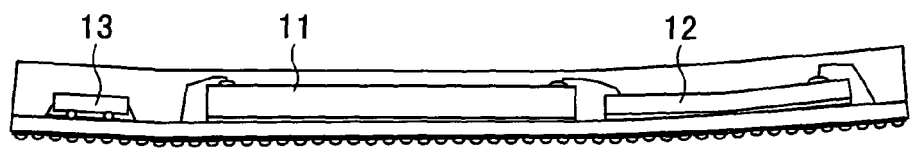
FIG. 4 is a side sectional view illustrating another arrangement example of a connection of a semiconductor chip and a circuit substrate in the semiconductor device.

The MCM 10 of the present embodiment is arranged such that the semiconductor chips 11, 12 and 13 and the circuit substrate 14 are connected based on a wire bonding method. However, the technology is not limited to this. Namely, the MCM 10 may be arranged such that the circuit substrate 14 and the semiconductor chips 11, 12 and 13 are connected via bonding pads 18 on the semiconductor chips 11, 12 and 13, based on a flip chip method, as illustrated in FIG. 3. The MCM 10 may be arranged such that the circuit substrate 14 and the semiconductor chips 11, 12 and 13 are connected based on both the wire bonding method and the flip chip method, as illustrated in FIG. 4.

In addition, the MCM 10 of the present embodiment deals with the case where three semiconductor chips, 11, and 13 are mounted. However, the number of semiconductor chips is not limited to three, provided that the number of the semiconductor chips is two or more. Furthermore, the technology includes and covers cases where the semiconductor chips are not arranged in one line.

Figure 5A:
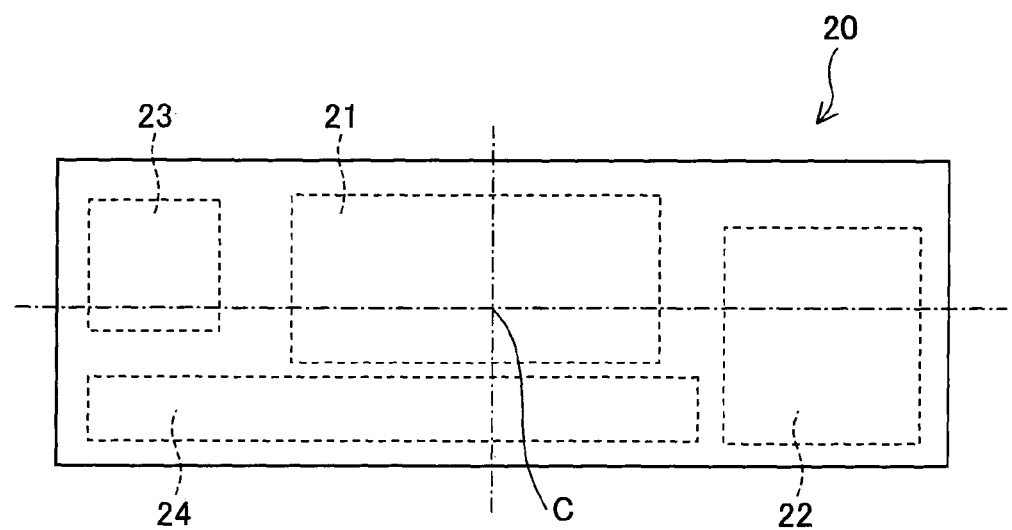
FIG. 5(a) is a plan view illustrating another embodiment of a semiconductor device.
Figure 5B:
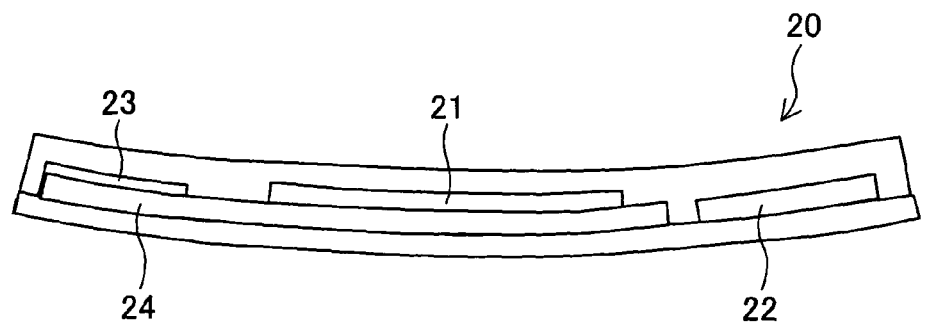
FIG. 5(b) is a side sectional view of FIG. 5(a).

FIG. 5(a) is a view illustrating an MCM 20 in which five semiconductor chips are not arranged in one line. FIG. 5(a) is a drawing viewed from the resin sealing surface side in a direction perpendicular to the semiconductor chip mounting surface of the circuit substrate 14. FIG. 5(b) is a side sectional view of the MCM 20 in FIG. 5(a).

As illustrated in FIGS. 5(a) and 5(b), the present embodiment is not limited to a specific arrangement, provided that a thickness of a semiconductor chip 21 to be mounted so as to traverse a center line C of the MCM 20 is thicker than the thickness of any of the other semiconductor chips 22 through 24. This allows the effect of reduction in warpage. Thus, it is possible to change, in accordance with the design, the number of semiconductor chips and how to arrange the semiconductor chips.

Figure 6:
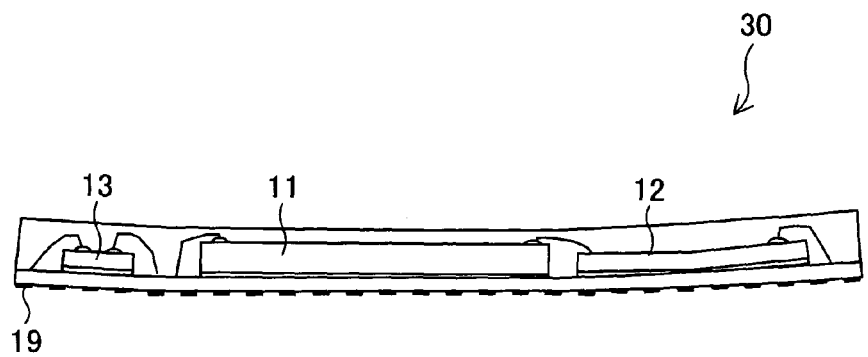
FIG. 6 is a side sectional view of yet another embodiment of a semiconductor device.
Figure 7A:
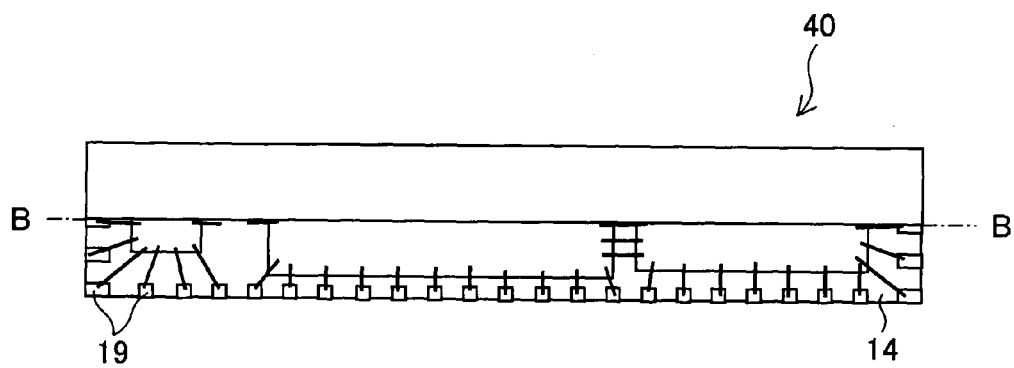
FIG. 7(a) is a plan view of yet another embodiment of a semiconductor device.
Figure 7B:
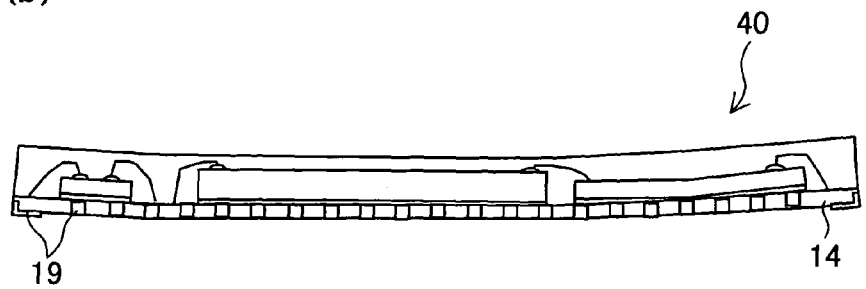
FIG. 7(b) is a side sectional view of the semiconductor device in FIG. 7(a), taken along line B-B in FIG. 7(a).

The present embodiment deals with the case where the solder is supplied to the external terminals 17 of the circuit substrate 14 so that a ball or a bump is provided. However, the present embodiment is not limited to this. For example, the MCM 10 may be replaced with an MCM 30 having an LGA structure (Land Grid Array) in which external terminals 19 are merely provided as illustrated in FIG. 6, or may be replaced with an MCM 40 having a QFN structure (Quad Flat Non-Leaded) in which external terminals 19 are provided on the perimeter of the second surface of the circuit substrate 14 as illustrated in FIGS. 7(a) and 7(b) may also be possible.

Second Embodiment

Below is an explanation of another embodiment referring to drawings. The arrangement other than what is explained in the present embodiment is the same as First Embodiment. For convenience, members having the same functions as those illustrated in the drawings of First Embodiment have the same reference numerals, and the explanation thereof is omitted.

Figure 8:
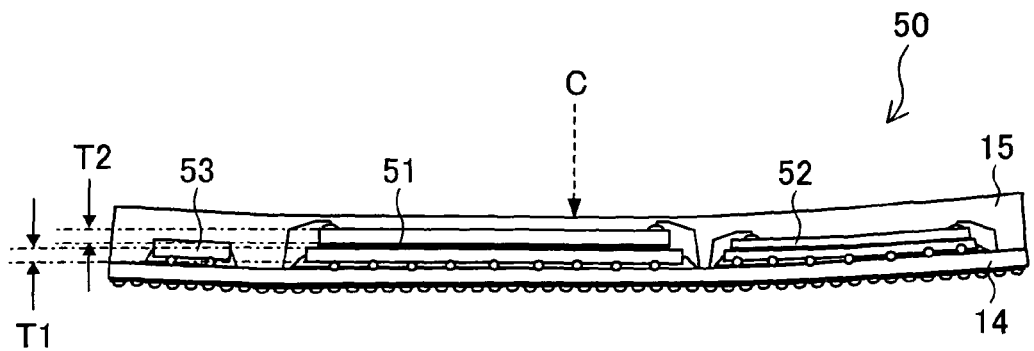
FIG. 8 is a side sectional view of yet another embodiment of a semiconductor device.

FIG. 8 is a side sectional view illustrating a cross section which passes through a center line C of an MCM 50.

The MCM 50 of the present embodiment includes a stacked semiconductor chip 51 having a stacked structure, a stacked semiconductor chip 52 having a stacked structure, a semiconductor chip 53, a circuit substrate 14, and a sealing resin 15, as illustrated in FIG. 8.

The stacked semiconductor chip 51, the stacked semiconductor chip 52 and the semiconductor chip 53 are mounted on the circuit substrate 14 so as to be juxtaposed (so as not to overlap). Two semiconductor chips are stacked in the stacked semiconductor chip 51. Two semiconductor chips are stacked in the stacked semiconductor chip 52. Therefore, these five semiconductor chips are mounted in the MCM 50.

In each of the stacked semiconductor chips 51 and 52, the lower semiconductor chip is connected with the circuit substrate 14 based on the flip chip method and the upper semiconductor chip is connected with the circuit substrate 14 based on the wire bonding method. The semiconductor chip 53 is connected with the circuit substrate 14 based on the flip chip method. This allows each of the stacked semiconductor chip 51, the stacked semiconductor chip 52 and the semiconductor chip 53 to have a signal input and output path.

The MCM 50 has a center line C as similar to the MCM 10. That is to say, the center line C is a virtual line which passes through the center of the MCM 50 and which is perpendicular to the semiconductor chip mounting surface of the circuit substrate 14.

The stacked semiconductor chip 51 is arranged so as to traverse the center line C in the MCM 50. On both sides of the stacked semiconductor chip 51, the stacked semiconductor chip 52 and the semiconductor chip 53 are so arranged that the stacked semiconductor chips 51 and 52, and the semiconductor chip 53 form a line.

The stacked semiconductor chip 51 has an overall thickness of a silicon (T1+T2) in a direction perpendicular to the semiconductor chip mounting surface of the circuit substrate 14. T1 indicates a thickness of the lower semiconductor chip, and T2 indicates a thickness of the upper semiconductor chip.

The stacked semiconductor chip 51, the stacked semiconductor chip 52 and the semiconductor chip 53 are arranged so that the thickness in the direction perpendicular to the semiconductor mounting surface satisfies the inequality "stacked semiconductor chip 51>stacked semiconductor chip 52>semiconductor chip 53", as illustrated in FIG. 8.

As such, the MCM 50 has a thicker overall thickness of the semiconductor chip 51 to be mounted so as to traverse the center line C of the MCM 50 than the overall thickness of each of the other stacked semiconductor chip 52 and semiconductor chip 53. This allows an increase in the rigidity of the MCM 50, thereby enabling to suppress the warpage which will be generated in the MCM 50.

That is to say, the semiconductor chip to be mounted in the MCM of the present embodiment is not limited to a stacked structure, provided that the overall thickness of a semiconductor chip or a stacked semiconductor chip to be mounted so as to traverse the center line C of the MCM is thicker than the overall thickness of any of the other semiconductor chips and the stacked semiconductor chips.

In addition, the MCM 50 of the present embodiment may include a heat sink in the semiconductor chip of a stacked structure, which semiconductor chip is mounted so as to traverse the center line C.

Figure 9:
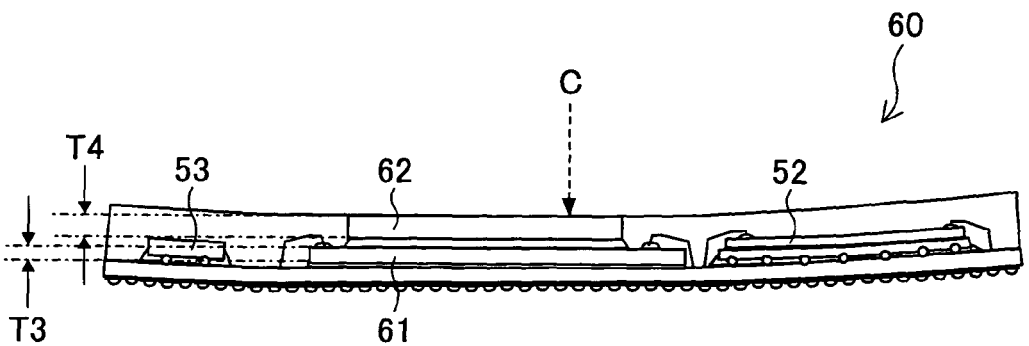
FIG. 9 is a side sectional view of yet another embodiment of a semiconductor device.

FIG. 9 is a side sectional view illustrating a cross section which passes through a center line C of an MCM 60 including a heat sink 62.

The MCM 60 of the present embodiment includes (i) an arrangement of the MCM 50 but excluding the stacked semiconductor chip 51 and (ii) a semiconductor chip 61 on which a heat sink 62 (warp prevention member) is stacked. The semiconductor chip 61 is mounted so as to traverse the center line C.

The semiconductor chip 61 is connected to the circuit substrate 14 based on the wire bonding method. The heat sink 62 is made of a metal, for example a plate whose main material is copper. The heat sink 62 is provided to improve the heat radiating property of the semiconductor chip 61. The heat sink 62 is exposed on the resin sealing surface side.

The semiconductor chip 61 has a thickness T3, and the heat sink 62 has a thickness T4. Thus, the constituent to be mounted so as to traverse the center line C has an overall thickness (T3+T4). Each of the stacked semiconductor chip 52 and the semiconductor chip 53 has a thinner overall thickness in the direction perpendicular to the semiconductor chip mounting surface than the overall thickness (T3+T4), as illustrated in FIG. 9

Therefore, in the MCM 60, the overall thickness of the constituent to be mounted so as to traverse the center line C of the MCM 60 is thicker than the overall thickness of any of the other stacked semiconductor chip 52 and the semiconductor chip 53. This allows the rigidity of the MCM 60 to increase, thereby enabling to suppress the warpage which is generated in the MCM 60.

Thus, the present embodiment is not limited to the arrangement in which the heat sink is stacked on the semiconductor chip to be mounted so as to traverse the center line C of the MCM, provided that the overall thickness of a semiconductor chip on which the heat sink is stacked is thicker than the overall thickness of any of the other semiconductor chips and the stacked semiconductor chips.

It is preferable that the circuit substrate 14 has a thickness thinner than the overall thickness of the stacked semiconductor chip 51 and thinner than the overall thickness of the semiconductor chip 61 and the heat sink 62. This allows the warpage prevention effect to be further enhanced. Thus, (i) the rigidity of the stacked semiconductor chip 51 and (ii) the overall rigidity of the semiconductor chip 61 and the heat sink 62 relatively increase with respect to the circuit substrate 14, thereby allowing further enhancement of the warp suppressing effect.

It is also preferable that (i) the stacked semiconductor chip 51 and (ii) a combination of the semiconductor chip 61 and the heat sink 62 have an overall thickness which is not thinner than half of the thickness of the sealing resin 15. This allows the warp prevention effect to be further enhanced.

Furthermore, the warp suppression effect is further effective in a packaging structure which readily warps, in which an aspect ratio is 4 or over, and an MCM has an overall thickness not more than 600 (μm). The total thickness indicates a sum of the thickness of the circuit substrate and the thickness of the sealing resin 15.

The MCM 60 of the present embodiment includes a semiconductor chip 61 on which a heat sink 62 is stacked. This allows the heat generated in the semiconductor chip 61 to be effectively radiated. This results in that the reliability of the MCM 60 is improved.

The constituent member which is stacked on the semiconductor chip 61 is not limited to the heat sink 62, provided that the member prevents the warpage in the MCM 60 without badly affecting the function of the MCM 60. For example, the member may be a dummy chip, an electromagnetic shielding plate or the like. This achieves the effect to suppress the warpage, and this allows the semiconductor chip 61 to possess a different feature (for example, heat radiating property, electromagnetic shielding property, insulating property or the like) than the function of the semiconductor chip.

The present embodiment deals with the case where the MCM 50 of the stacked semiconductor 51 has a stacked structure in which the lower semiconductor chip is connected to the circuit substrate 14 based on the flip chip method and the upper semiconductor chip is connected to the circuit substrate 14 based on the wire bonding method. However, the technology is not limited to this.

Figure 10:
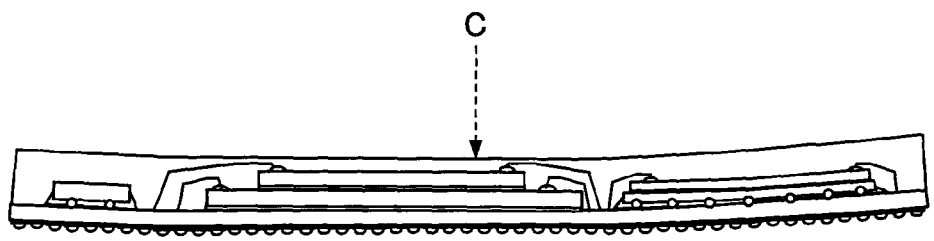
FIG. 10 is a side sectional view illustrating another arrangement example of a connection of a semiconductor chip and a circuit substrate in the semiconductor device in FIG. 8.
Figure 11:
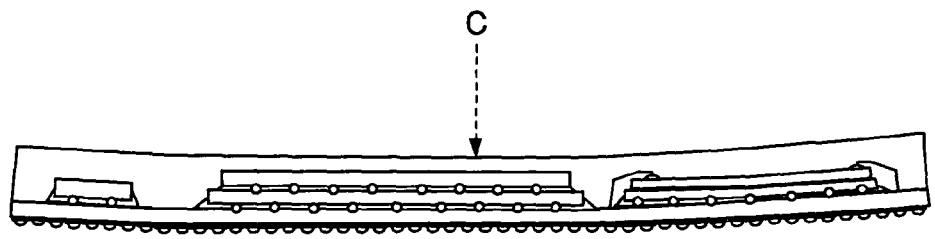
FIG. 11 is a side sectional view illustrating yet another arrangement example of a connection of a semiconductor chip and a circuit substrate in the semiconductor device.
Figure 12:
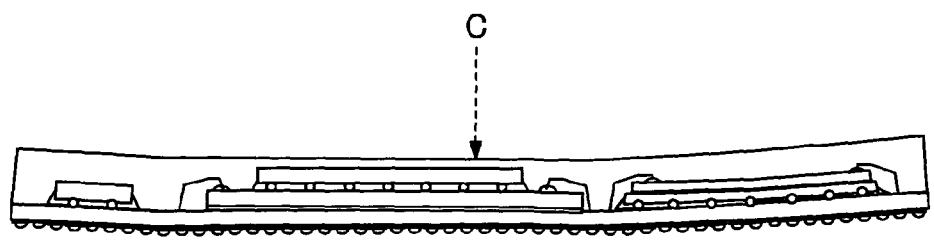
FIG. 12 is a side sectional view illustrating yet another arrangement example of a connection of a semiconductor chip and a circuit substrate in the semiconductor device.

That is to say, the stacked semiconductor chip 51 can be alternatively a stacked structure in which both the upper and lower semiconductor chips are connected with the circuit substrate 14 based on the wire bonding method, as illustrated in FIG. 10, or can be alternatively a stacked structure in which both the upper and lower semiconductor chips are connected to the circuit substrate 14 based on the flip chip method, as illustrated in FIG. 11. The stacked semiconductor chip 51 can be alternatively a stacked structure in which the lower semiconductor chip is connected with the circuit substrate 14 based on the wire bonding method and the upper semiconductor chip is connected with the lower semiconductor chip based on the flip chip method, as illustrated in FIG. 12.

The present embodiment deals with the case where the MCM 50 includes the stacked semiconductor chips 51 and 52, each on which two semiconductor chips are stacked. However, in the present embodiment, the number of semiconductor chips to be stacked on the stacked semiconductor chips 51 and 52 is not limited to two, but may be two or more.

Figure 13:
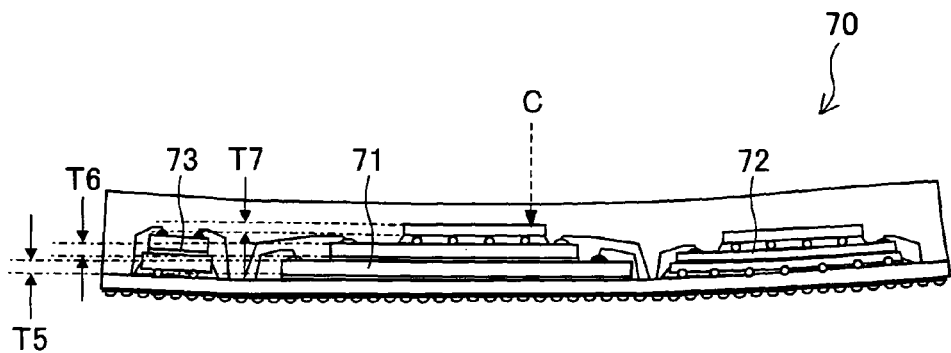
FIG. 13 is a side sectional view illustrating yet another embodiment of a semiconductor device.

FIG. 13 is a side sectional view illustrating a cross section which passes through a center line C of an MCM 70.

The MCM 70 mounts a stacked semiconductor chip 71 on which three semiconductor chips are stacked, a stacked semiconductor chip 72 on which three semiconductor chips are stacked, and a stacked semiconductor chip 73 on which two semiconductor chips are stacked.

The stacked semiconductor chip 71 is mounted so as to traverse the center line C of the MCM 70. In addition, the stacked semiconductor chip 71 has a thickness of an overall silicon thickness (T5+T6+T7) in a direction perpendicular to the semiconductor chip mounting surface of the circuit substrate 14. T5 indicates a thickness of the lower semiconductor chip, T6 indicates a thickness of the middle semiconductor chip, and T7 indicates a thickness of the upper semiconductor chip. The overall thickness (T5+T6+T7) is thicker than the overall thickness of any of the stacked semiconductor chip 72 and the stacked semiconductor chip 73.

As such, the present embodiment is not limited to a specific arrangement, provided that an overall thickness of a stacked semiconductor chip 71 to be mounted so as to traverse the center line C of the MCM 70 is thicker than the overall thickness of any of the other stacked semiconductor chips 72 and 73. Thus, it is possible to change, in accordance with the design, the number of semiconductor chips and how to arrange the semiconductor chips.

Mounting of a plurality of semiconductor chips on the circuit substrate in a stacked structure allows the mounting of a plurality of semiconductor chips within a limited size (area) of the semiconductor chip mounting surface on the circuit substrate. This allows the MCM to possess multiple functions.

Third Embodiment

Described below is a further embodiment referring to drawings. The arrangement other than what is explained in the present embodiment is the same as First and Second Embodiments. For convenience, members having the same functions as those illustrated in the drawings of First and Second Embodiments have the same reference numerals, and the explanation thereof is omitted.

FIG. 14(a) is a plan view from the resin sealing surface side of an MCM 80 in a direction perpendicular to the mounting surface of semiconductor chips 81, 82 and 83 on a circuit substrate 14. FIG. 14(b) is a side sectional view of the MCM 80 in FIG. 14(a), taken along the line D-D. The line D-D in FIG. 14(a) passes through a center line C of the MCM 80. FIG. 14(b) illustrates the cross section which passes through the center line C in the MCM 80.

The MCM 80 of the present embodiment includes semiconductor chips 81, 82 and 83, a circuit substrate 14 and a sealing resin 15, as illustrated in FIGS. 14(a) and 14(b).

The semiconductor chips 81, 82 and 83 are bare semiconductor chips, each of which is integrated to have its function. The semiconductor chips 81, 82 and 83 are mounted on the circuit substrate 14 so as to be juxtaposed (so as not to overlap). The semiconductor chips 81 and 82 are wire bonded via a bonding wire 16. The circuit substrate 14 and a respective of the semiconductors 81, 82 and 83 are wire bonded, via a bonding wire 16. This ensures the provision of signal input and output paths for the semiconductor chips 81, 82 and 83, respectively.

The MCM 80 has a center line C, as similar to the MCM 10. That is to say, the center line C is a virtual line which passes through the center of the MCM 80 and which is perpendicular to the semiconductor chip mounting surface of the circuit substrate 14. In the MCM 80, the semiconductor chip 81 is arranged so as to traverse the center line C.

According to the embodiment, in the MCM 80, the semiconductor chip mounting surface of the circuit substrate 14 is arranged so as to have three partitions, as illustrated in FIG.

14(*a*). Each of the three partitions has a same length in a longitudinal direction of the MCM 80 (lateral direction in FIG. 14(*a*)). The semiconductor chips 81, 82 and 83 are arranged such that a bending point P does not emerge in the partition of the three partitions which partition includes the center line C.

The bending point P is thus located outside the partition which includes the center line C, and so a warpage generated in the MCM 80 is suppressed, as compared to an arrangement in which a bending point P emerges near the center line C.

Figure 14:
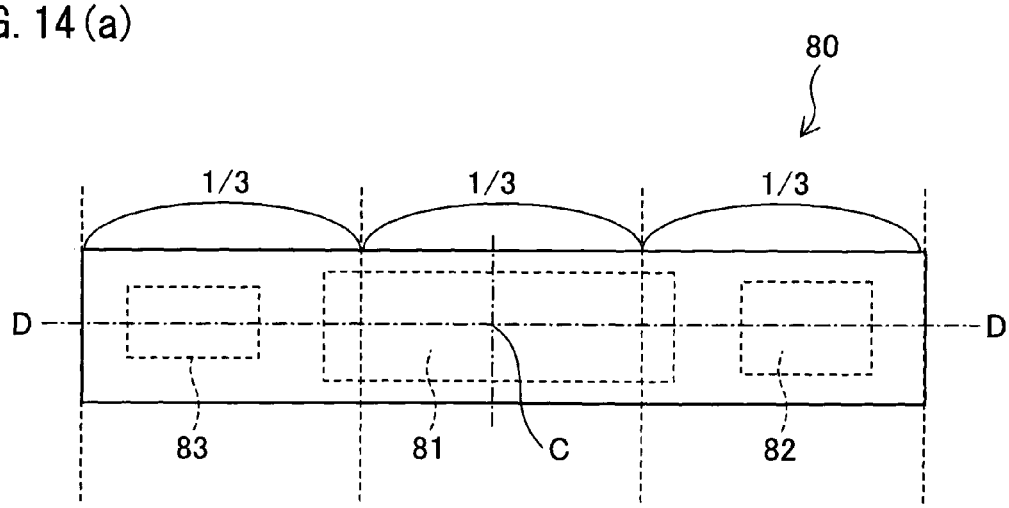
FIG. 14(a) is a plan view of yet another embodiment of a semiconductor device.
FIG. 14(b) is a side sectional view of the semiconductor device in FIG. 14(a), taken along line D-D in FIG. 14(a).
Figure 14:
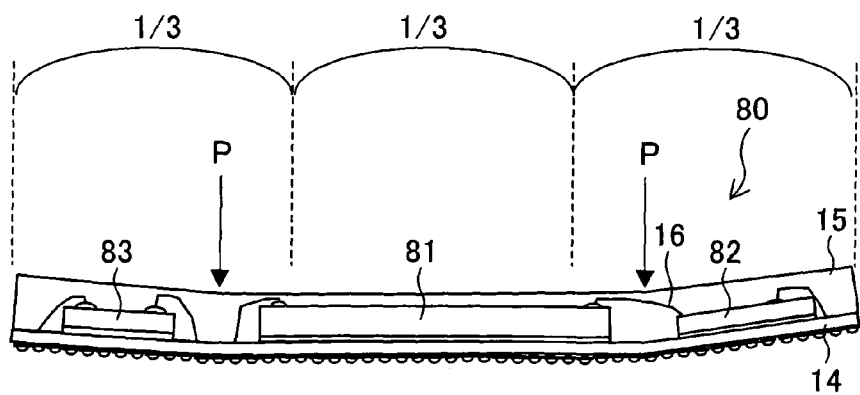
Figure 15:
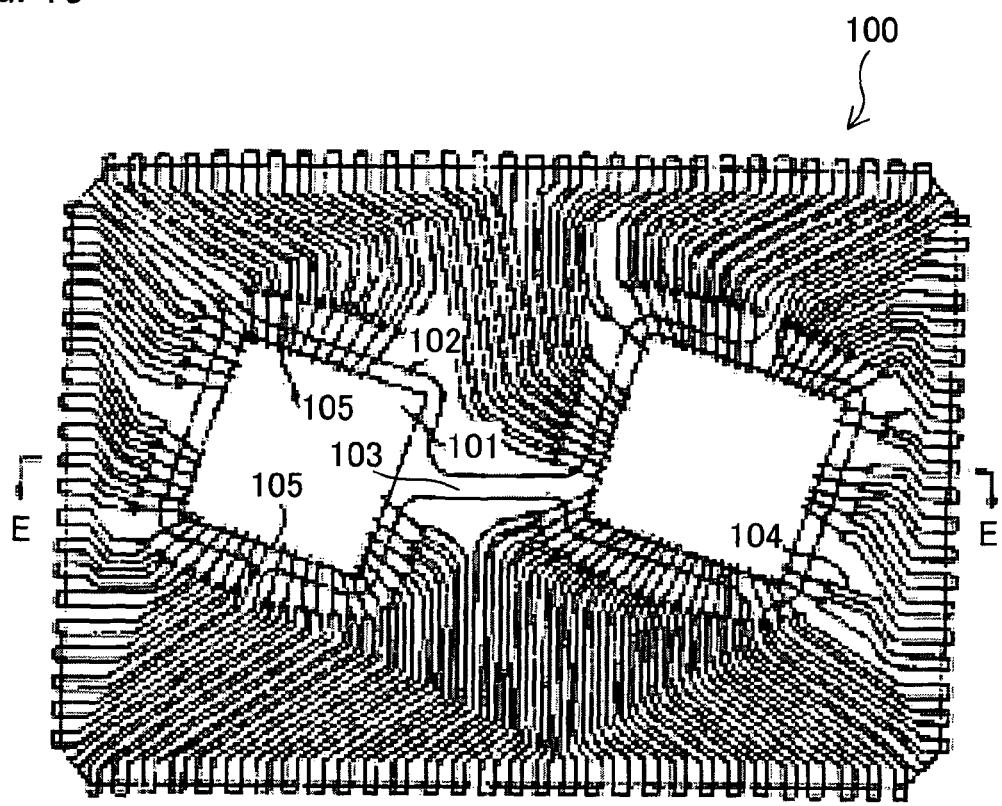
FIG. 15 is a plan view illustrating the structure of a conventional semiconductor device which has not been subjected to sealing with a resin.
Figure 16:
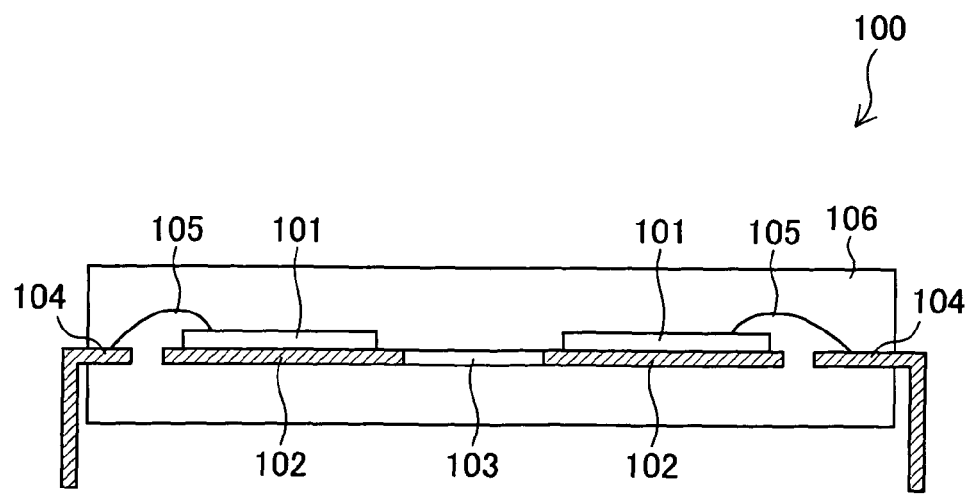
FIG. 16 is a sectional side view of the conventional semiconductor device which has been subjected to the sealing with the resin, taken on line E-E in FIG. 15.
Figure 17:
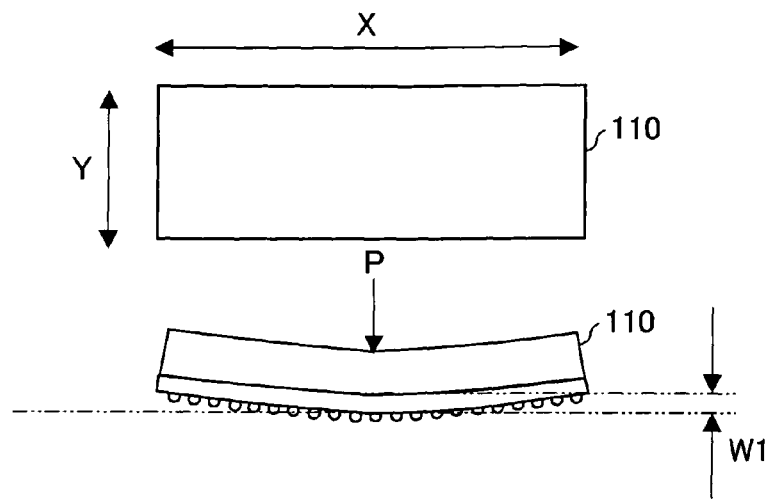
FIG. 17 is a view for explaining a warpage generating in the conventional MCM-packaged semiconductor device.
Figure 18:
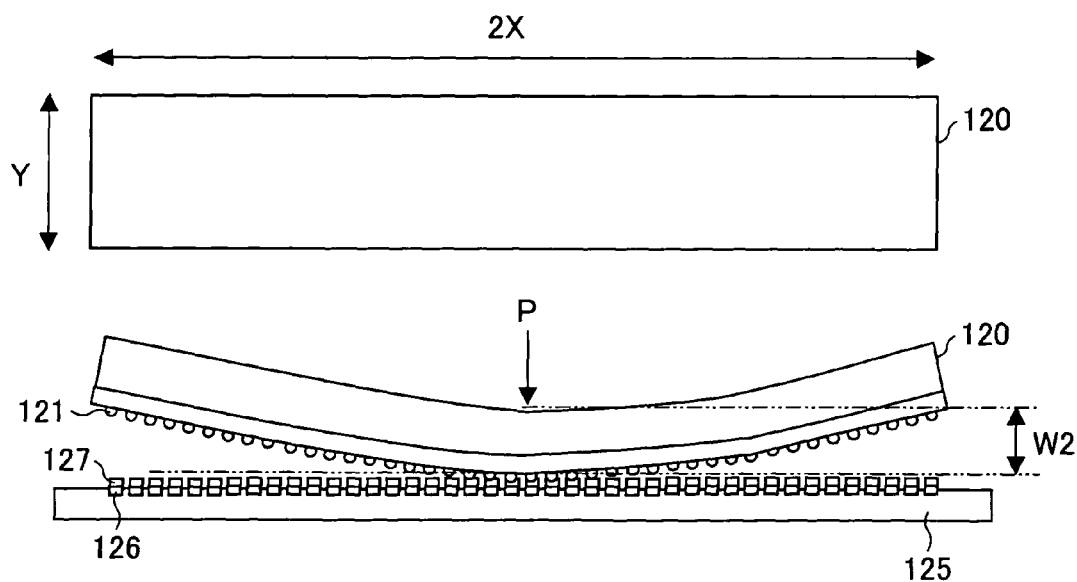
FIG. 18 is a view for explaining a warpage generating in a semiconductor device larger than the conventional semiconductor device in FIG. 17.

In addition, the semiconductor chip 81, 82 and 83 are arranged so that a thickness in a direction perpendicular to the semiconductor chip mounting surface satisfies the inequality "semiconductor chip 81>semiconductor chip 83>semiconductor chip 82", as illustrated in FIG. 14(*b*).

As such, the MCM 80 has a thicker thickness of the semiconductor chip 81 to be mounted so as to traverse the center line C of the MCM 80 than the thickness of each of the other semiconductor chips 82 and 83. This allows an increase in the rigidity of the MCM 80, thereby enabling to further suppress the warpage which will be generated in the MCM 80.

The technology is not limited to the description of the embodiments above, but may be altered by a skilled person in the art within the scope of the claims. An embodiment based on a proper combination of technical means disclosed in different embodiments is encompassed in the technical scope of the present technology.

The technology is directed to a semiconductor device referred to as an MCM (Multi Chip Module), and is applicable to a packaging structure of such a semiconductor device. The technology, however, is not limited to this, and is applicable to other technical fields. For example, the technology is applicable to a resin forming field in which components are manufactured by resin forming.

As above, the semiconductor device includes an MCM packaging structure, the MCM packaging structure including: a plurality of semiconductor chips; and a circuit substrate having a substantially rectangular outer shape, wherein: the plurality of semiconductor chips are juxtaposed on a semiconductor chip mounting surface of the circuit substrate, on which mounting surface the plurality of semiconductor chips are mounted, and the semiconductor chip mounting surface is covered with a sealing resin along an outer edge of the circuit substrate so that the plurality of semiconductor chips are sealed, wherein a semiconductor chip of the plurality of semiconductor chips which is mounted so as to traverse a center line has a thicker thickness in a direction perpendicular to the semiconductor chip mounting surface than a thickness, in the direction, of any of the other semiconductor chips of the plurality of semiconductor chips, the center line being defined by an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface.

The semiconductor chip to be mounted so as to traverse the center line has a thicker thickness in a direction perpendicular to the semiconductor chip mounting surface than the thickness of any of the other semiconductor chips which is mounted on the semiconductor chip mounting surface. This allows an increase in the rigidity of the semiconductor device, thereby enabling to suppress the warpage which will be generated in the semiconductor device.

The semiconductor device is preferably arranged such that the semiconductor chip of the plurality of semiconductor chips which is mounted so as to traverse the center line has a surface via which the semiconductor chip is mounted on the semiconductor chip mounting surface, which surface has a larger area than an area of any of surfaces via which the other semiconductor chips are respectively mounted on the semiconductor chip mounting surface.

According to the arrangement, the rigidity of the semiconductor device further increases, thereby enabling to further suppress the warpage which will be generated in the semiconductor device.

In addition, the semiconductor device is preferably arranged such that the circuit substrate has a thinner thickness in the direction perpendicular to the semiconductor chip mounting surface than the thickness of the semiconductor chip of the plurality of semiconductor chips which is mounted so as to traverse the center line.

According to the arrangement, the relative rigidity of the semiconductor chip to be mounted so as to traverse the center line increases with respect to the circuit substrate, thereby enabling to further enhance the warpage suppression effect.

In addition, the semiconductor device is preferably arranged such that the thickness of the semiconductor chip of the plurality of semiconductor chips which is mounted so as to traverse the center line is thicker than half a thickness of the sealing resin in the direction perpendicular to the semiconductor mounting surface.

According to the arrangement, the rigidity of the semiconductor device further increases, thereby enabling to further suppress the warpage which will be generated in the semiconductor device.

The semiconductor device is preferably arranged such that in the MCM packaging structure, the semiconductor chip mounting surface has an aspect ratio of 4 or more, and a total thickness is not more than 600 μm, the total thickness indicating a sum of a thickness of the circuit substrate in the direction perpendicular to the semiconductor chip mounting surface and a thickness of the sealing resin in the direction perpendicular to the semiconductor chip mounting surface.

A warpage generates remarkably in a semiconductor device in a case the semiconductor device has an MCM packaging structure in which an aspect ratio of the semiconductor chip mounting surface is 4 or over, and the MCM packaging structure has a total thickness of not more than 600 μm, the total thickness indicating the sum of the thickness of the circuit substrate in the direction perpendicular to the semiconductor chip mounting surface and the thickness of the sealing resin in the direction perpendicular to the semiconductor chip mounting surface. Therefore, it is possible for the warpage suppression effect to be more effectively achieved.

The semiconductor device includes an MCM packaging structure, the MCM packaging structure including: at least three semiconductor chips; and a circuit substrate having a substantially rectangular outer shape, wherein: the at least three semiconductors chips, each alone or stacked, are juxtaposed on a semiconductor chip mounting surface of the circuit substrate, on which mounting surface the at least three semiconductor chips are mounted, and the semiconductor chip mounting surface is covered with a sealing resin along an outer edge of the circuit substrate so that the at least three semiconductor chips are sealed, wherein a semiconductor chip of the at least three semiconductor chips which is mounted, alone or stacked, so as to traverse a center line has an overall thicker thickness in a direction perpendicular to the semiconductor chip mounting surface than a thickness, in the direction, of any of the other semiconductor chips of the at least three semiconductor chips, each of which is mounted, alone or stacked, the center line being defined by an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface.

The semiconductor chip to be mounted, alone or stacked, so as to traverse the center line has a thicker overall thickness in the direction perpendicular to the semiconductor chip mounting surface than the overall thickness of any of the other semiconductor chips which is mounted, alone or stacked, on the semiconductor chip mounting surface. This allows the increase in the rigidity of the semiconductor device, thereby enabling to suppress the warpage which will be generated in the semiconductor device.

In addition, mounting of a plurality of semiconductor chips on a circuit substrate in a stacked state allows the mounting of a plurality of semiconductor chips within a limited size of the semiconductor chip mounting surface on the circuit substrate. This allows the semiconductor device to possess multiple functions.

In addition, the semiconductor device is preferably arranged such that the circuit substrate has a thinner thickness in the direction perpendicular to the semiconductor chip mounting surface than the overall thickness of the semiconductor chip of the at least three semiconductor chips which is mounted, alone or stacked, so as to traverse the center line.

According to the arrangement, the relative rigidity of the semiconductor chip to be mounted, alone or stacked, so as to traverse the center line increases with respect to the circuit substrate, thereby enabling to further enhance the warpage suppression effect.

The semiconductor device is preferably arranged such that the overall thickness of the semiconductor chip of the at least three semiconductor chips which is mounted, alone or stacked, so as to traverse the center line is thicker than half a thickness of the sealing resin in the direction perpendicular to the semiconductor chip mounting surface.

According to the arrangement, the rigidity of the semiconductor device further increases, thereby enabling to further suppress the warpage which will be generated in the semiconductor device.

In addition, the semiconductor device is arranged such that in the MCM packaging structure, the semiconductor chip mounting surface has an aspect ratio of 4 or more, and a total thickness is not more than 600 µm, the total thickness indicating a sum of a thickness of the circuit substrate in the direction perpendicular to the semiconductor chip mounting surface and a thickness of the sealing resin in the direction perpendicular to the semiconductor chip mounting surface.

A warpage generates remarkably in a semiconductor device in a case the semiconductor device has an MCM packaging structure in which an aspect ratio of the semiconductor chip mounting surface is 4 or over, and the MCM packaging structure has a total thickness of not more than 600 µm, the total thickness indicating the sum of the thickness of the circuit substrate in the direction perpendicular to the semiconductor chip mounting surface and the thickness of the sealing resin in the direction perpendicular to the semiconductor chip mounting surface. Therefore, it is possible for the warpage suppression effect to be more effectively achieved.

The semiconductor device includes an MCM packaging structure, the MCM packaging structure including: a plurality of semiconductor chips; and a circuit substrate having a substantially rectangular outer shape, wherein: the plurality of semiconductor chips, each alone or stacked, are juxtaposed on a semiconductor chip mounting surface of the circuit substrate, on which mounting surface the plurality of semiconductor chips are mounted, and the semiconductor chip mounting surface is covered with a sealing resin along an outer edge of the circuit substrate so that the plurality of semiconductor chips are sealed, wherein a warpage prevention member is stacked on a semiconductor chip of the plurality of semiconductor chips which is mounted, alone or stacked, so as to traverse a center line, the center line being defined by an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface, and a total thickness, indicative of a sum of a thickness of the semiconductor chip and a thickness of the warpage prevention member each in a direction perpendicular to the semiconductor chip mounting surface, is thicker than a thickness, in the direction, of any of the other semiconductor chips of the plurality of semiconductor chips which are mounted, alone or stacked, on the semiconductor chip mounting surface.

The total thickness of a semiconductor chip on which a warpage prevention member is stacked, to be mounted, alone or stacked, so as to traverse the center line is thicker than the overall thickness of any of the other semiconductor chips which is mounted, alone or stacked, on the semiconductor chip mounting surface. The total thickness of the semiconductor chip indicates the thickness of the sum of the overall thickness of the semiconductor chip and the thickness of the warpage prevention member. This allows the increase in the rigidity of the semiconductor device, thereby enabling to further suppress the warpage which will be generated in the semiconductor device.

In addition, mounting of the warpage prevention member on the semiconductor chip to be mounted, alone or stacked, so as to traverse the center line allows the semiconductor device to achieve the effect to suppress the warpage, and allows the semiconductor chip to possess a different feature (for example, heat radiating property, electromagnetic shielding property, insulation property or the like) than the function of the semiconductor chip.

The semiconductor device is arranged such that the circuit substrate has a thinner thickness in the direction perpendicular to the semiconductor chip mounting surface than the total thickness of the semiconductor chip on which a warpage prevention member is stacked of the plurality of semiconductor chips which is mounted, alone or stacked, so as to traverse the center line.

According to the arrangement, the relative rigidity of the semiconductor chip on which the warpage prevention member is stacked, to be mounted, alone or stacked, so as to traverse the center line increases in respect to the circuit substrate, thereby enabling to further enhance the warpage suppression effect.

In addition, the semiconductor device is arranged such that the total thickness of the semiconductor chip on which a warpage prevention member is stacked of the plurality of semiconductor chips which is mounted, alone or stacked, so as to traverse the center line is thicker than half a thickness of the sealing resin in the direction perpendicular to the semiconductor chip mounting surface.

According to the arrangement, the rigidity of the semiconductor device further increases, thereby enabling to further suppress the warpage which will be generated in the semiconductor device.

In addition, the semiconductor device is arranged such that in the MCM packaging structure, the semiconductor chip mounting surface has an aspect ratio of 4 or more, and a total thickness is not more than 600 μm, the total thickness indicating a sum of a thickness of the circuit substrate in the direction perpendicular to the semiconductor chip mounting surface and a thickness of the sealing resin in the direction perpendicular to the semiconductor chip mounting surface.

A warpage generates remarkably in a semiconductor device in a case the semiconductor device has an MCM packaging structure in which an aspect ratio of the semiconductor chip mounting surface is 4 or over, and the MCM packaging structure has a total thickness of not more than 600 μm, the total thickness indicating the sum of the thickness of the circuit substrate in the direction perpendicular to the semiconductor chip mounting surface and the thickness of the sealing resin in the direction perpendicular to the semiconductor chip mounting surface. Therefore, it is possible for the warpage suppression effect to be more effectively achieved.

In addition, the semiconductor device is arranged such that the warpage prevention member is a heat sink made of metal or an electromagnetic shielding plate. This allows the heat generated in the semiconductor chip to be effectively radiated, or, the noise due to the electromagnetism to be prevented. This results in that the reliability of the semiconductor is improved.

The semiconductor device is a semiconductor device including an MCM packaging structure, the MCM packaging structure including: a plurality of semiconductor chips; and a circuit substrate having a substantially rectangular outer shape, wherein: the plurality of semiconductor chips are juxtaposed on a semiconductor chip mounting surface of the circuit substrate, on which mounting surface the plurality of semiconductor chips are mounted, and the semiconductor chip mounting surface is covered with a sealing resin along an outer edge of the circuit substrate so that the plurality of semiconductor chips are sealed, wherein the semiconductor chip mounting surface is partitioned in its longitudinal direction so as to have three partitions, each having a same length, no bending point appearing in a partition of the three partitions which includes a center line, the center line being defined by an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface.

The bending point is located outside the partition which includes the center line, and so a warpage generated in the semiconductor device is suppressed, as compared to an arrangement in which the bending point emerges near the center line.

In addition, each of the aforementioned semiconductor devices is mounted to other components such as a mounting substrate. In this regard, if a warpage is generated in the semiconductor device, the semiconductor device will not come into contact with the mounting surface when mounted on the other components. This causes the possibility of an inadequate connection to increase. On the other hand, since the semiconductor device allows the suppression of the warpage, it is possible to reduce inadequate connection occurred due to the warpage in the semiconductor device.

The embodiments and concrete examples of implementation discussed in the foregoing detailed explanation serve solely to illustrate the technical details of the present technology, which should not be narrowly interpreted within the limits of such embodiments and concrete examples, but rather may be applied in many variations within the spirit of the technology, provided such variations do not exceed the scope of the patent claims set forth below.

What is claimed is:

1. A semiconductor device comprising an MCM packaging structure, said MCM packaging structure comprising:
   a plurality of semiconductor chips;
   a circuit substrate having a substantially rectangular outer shape, wherein the plurality of semiconductor chips are juxtaposed on a semiconductor chip mounting surface of the circuit substrate, on which mounting surface the plurality of semiconductor chips are mounted; and
   a sealing resin that covers the semiconductor chip mounting surface and that extends along an outer edge of the circuit substrate and which completely encapsulates the plurality semiconductor chips so that the plurality of semiconductor chips are sealed within the resin, wherein a semiconductor chip of the plurality of semiconductor chips which is mounted so as to traverse a center line has a greater thickness in a direction perpendicular to the semiconductor chip mounting surface than a thickness, in the direction, of any of the other semiconductor chips of the plurality of semiconductor chips, said center line being defined by an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface.

2. The semiconductor device as set forth in claim 1, wherein said semiconductor chip of the plurality of semiconductor chips which is mounted so as to traverse the center line has a surface via which said semiconductor chip is mounted on the semiconductor chip mounting surface, which surface has a larger area than an area of any of surfaces via which said the other semiconductor chips are respectively mounted on the semiconductor chip mounting surface.

3. The semiconductor device as set forth in claim 1, wherein the circuit substrate has a thinner thickness in the direction perpendicular to the semiconductor chip mounting surface than the thickness of said semiconductor chip of the plurality of semiconductor chips which is mounted so as to traverse the center line.

4. The semiconductor device as set forth in claim 1, wherein the thickness of said semiconductor chip of the plurality of semiconductor chips which is mounted so as to traverse the center line is thicker than half a thickness of the sealing resin in the direction perpendicular to the semiconductor mounting surface.

5. The semiconductor device as set forth in claim 1, wherein:
   in the MCM packaging structure, the semiconductor chip mounting surface has an aspect ratio, representing a ratio of a length to a width of the mounting surface, of 4 or more, and
   a total thickness is not more than 600 μm, the total thickness indicating a sum of a thickness of the circuit substrate in the direction perpendicular to the semiconductor chip mounting surface and a thickness of the sealing resin in the direction perpendicular to the semiconductor chip mounting surface.

6. A semiconductor device comprising an MCM packaging structure, said MCM packaging structure comprising:
   at least three semiconductor chips units, wherein each semiconductor chip unit comprises a single semiconductor chip or a plurality of stacked semiconductor chips;

a circuit substrate having a substantially rectangular outer shape, wherein said at least three semiconductor chip units are juxtaposed on a semiconductor chip mounting surface of the circuit substrate, on which mounting surface said at least three semiconductor chip units are mounted; and a sealing resin that covers the semiconductor chip mounting surface and that extends along an outer edge of the circuit substrate and which completely encapsulates said at least three semiconductor chip units, wherein a semiconductor chip unit of said at least three semiconductor chip units which is mounted so as to traverse a center line has a greater thickness in a direction perpendicular to the semiconductor chip mounting surface than a thickness, in the direction, of any of the other semiconductor chip units of said at least three semiconductor chip units, said center line being defined by an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface.

7. The semiconductor device as set forth in claim 6, wherein the circuit substrate has a thinner thickness in the direction perpendicular to the semiconductor chip mounting surface than the thickness of said semiconductor chip unit of the at least three semiconductor chip units which is mounted so as to traverse the center line.

8. The semiconductor device as set forth in claim 6, wherein the overall thickness of said semiconductor chip unit of the at least three of semiconductor chip units which is mounted so as to traverse the center line is thicker than half a thickness of the sealing resin in the direction perpendicular to the semiconductor chip mounting surface.

9. The semiconductor device as set forth in claim 6, wherein:
in the MCM packaging structure, the semiconductor chip mounting surface has an aspect ratio, representing a ratio of a length to a width of the mounting surface, of 4 or more, and
a total thickness is not more than 600 μm, the total thickness indicating a sum of a thickness of the circuit substrate in the direction perpendicular to the semiconductor chip mounting surface and a thickness of the sealing resin in the direction perpendicular to the semiconductor chip mounting surface.

10. A semiconductor device comprising an MCM packaging structure, said MCM packaging structure comprising:
a plurality of semiconductor chip units, wherein each semiconductor chip unit comprises a single semiconductor chip or a plurality of stacked semiconductor chips;
a circuit substrate having a substantially rectangular outer shape, wherein the plurality of semiconductor chip units are juxtaposed on a semiconductor chip mounting surface of the circuit substrate, on which mounting surface the plurality of semiconductor chip units are mounted, and
a sealing resin that covers the semiconductor chip mounting surface and that extends along an outer edge of the circuit substrate and which completely encapsulates the plurality of semiconductor chip units, wherein a warpage prevention member is stacked on a semiconductor chip unit of the plurality of semiconductor chip units which is mounted so as to traverse a center line, said center line being defined by an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface, and a total thickness, indicative of a sum of a thickness of said semiconductor chip unit and a thickness of the warpage prevention member each in a direction perpendicular to the semiconductor chip mounting surface, is greater than a thickness, in the direction, of any of the other semiconductor chip units of the plurality of semiconductor chip units.

11. The semiconductor device as set forth in claim 10, wherein the circuit substrate has a thinner thickness in the direction perpendicular to the semiconductor chip mounting surface than the total thickness of said semiconductor chip unit and the warpage prevention member which is mounted so as to traverse the center line.

12. The semiconductor device as set forth in claim 10, wherein the total thickness of said semiconductor chip unit and the warpage prevention member which is mounted so as to traverse the center line is greater than half a thickness of the sealing resin in the direction perpendicular to the semiconductor chip mounting surface.

13. The semiconductor device as set forth in claim 10, wherein:
in the MCM type packaging structure, the semiconductor chip mounting surface has an aspect ratio, representing a ratio of a length to a width of the mounting surface, of 4 or more, and
a total thickness is not more than 600 μm, the total thickness indicating a sum of a thickness of the circuit substrate in the direction perpendicular to the semiconductor chip mounting surface and a thickness of the sealing resin in the direction perpendicular to the semiconductor chip mounting surface.

14. The semiconductor device as set forth in claim 10, wherein the warpage prevention member is a heat sink made of metal or an electromagnetic shielding plate.

15. A semiconductor device comprising an MCM packaging structure, said MCM packaging structure including:
a plurality of semiconductor chips; and a circuit substrate having a substantially rectangular outer shape, wherein:
the plurality of semiconductor chips are juxtaposed on a semiconductor chip mounting surface of the circuit substrate, on which mounting surface the plurality of semiconductor chips are mounted, and
the semiconductor chip mounting surface is covered with a sealing resin along an outer edge of the circuit substrate so that the plurality of semiconductor chips are sealed, wherein the semiconductor chip mounting surface is partitioned in its longitudinal direction so as to have three partitions, each having a same length, no bending point appearing in a partition of the three partitions which includes a center line, the center line being defined by an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface.

16. A semiconductor device comprising an MCM packaging structure, said MCM packaging structure comprising:
a plurality of semiconductor chips; a substrate for mounting the plurality of semiconductor chips, wherein the plurality of semiconductor chips are juxtaposed on a semiconductor chip mounting surface of the substrate, on which mounting surface the plurality of semiconductor chips are mounted; and a sealing resin that covers the semiconductor chip mounting surface and that completely encapsulates the plurality of semiconductor chips so that they are sealed within the resin, wherein a semiconductor chip of the plurality of semiconductor chips which is mounted so as to traverse a center line has a greater thickness in a direction perpendicular to the semiconductor chip mounting surface than a thickness, in the direction, of any of the other semiconductor chips of the plurality of semiconductor chips, said center line being defined by an intersection of (i) a first cross section which divides the semiconductor chip mounting surface into two in a horizontal direction of the semiconductor chip mounting surface and (ii) a second cross section which divides the semiconductor chip mounting surface into two in a vertical direction of the semiconductor chip mounting surface.

17. The semiconductor device as set forth in claim 16, wherein said semiconductor chip of the plurality of semiconductor chips which is mounted so as to traverse the center line has a surface via which said semiconductor chip is mounted on the semiconductor chip mounting surface, which surface has a larger area than an area of any of surfaces via which said the other semiconductor chips are respectively mounted on the semiconductor chip mounting surface.

18. The semiconductor device as set forth in claim 16, wherein the substrate has a thinner thickness in the direction perpendicular to the semiconductor chip mounting surface than the thickness of said semiconductor chip of the plurality of semiconductor chips which is mounted so as to traverse the center line.

19. The semiconductor device as set forth in claim 16, wherein the thickness of said semiconductor chip of the plurality of semiconductor chips which is mounted so as to traverse the center line is thicker than half a thickness of the sealing resin in the direction perpendicular to the semiconductor mounting surface.

20. A semiconductor device comprising an MCM packaging structure, said MCM packaging structure comprising:
at least three semiconductor chip units, wherein each semiconductor chip unit comprises a single semiconductor chip or a plurality of stacked semiconductor chips;
a substrate for mounting the at least three semiconductor chip units, wherein said at least three semiconductor chip units are juxtaposed on a semiconductor chip mounting surface of the substrate, on which mounting surface said at least three semiconductor chips are mounted; and
a sealing resin that covers the semiconductor chip mounting surface and that completely encapsulates said at least three semiconductor chip units such that the chip units are sealed within the resin, wherein a semiconductor chip unit of said at least three semiconductor chip units which is mounted so as to traverse a center line has a greater thickness in a direction perpendicular to the semiconductor chip mounting surface than a thickness, in the direction, of any of the other semiconductor chip units of said at least three semiconductor chip units, said center line being defined by an intersection of (i) a first cross section which divides the semiconductor chip mounting surface into two in a horizontal direction of the semiconductor chip mounting surface and (ii) a second cross section which divides the semiconductor chip mounting surface into two in a vertical direction of the semiconductor chip mounting surface.

21. The semiconductor device as set forth in claim 20, wherein the substrate has a thinner thickness in the direction perpendicular to the semiconductor chip mounting surface than the thickness of said semiconductor chip unit of the at least three semiconductor chip units which is mounted so as to traverse the center line.

22. The semiconductor device as set forth in claim 20, wherein the thickness of said semiconductor chip unit of the at least three of semiconductor chip units which is mounted so as to traverse the center line is thicker than half a thickness of the sealing resin in the direction perpendicular to the semiconductor chip mounting surface.

23. A semiconductor device comprising an MCM packaging structure, said MCM packaging structure comprising:
a plurality of semiconductor chips;
a substrate having a substantially rectangular outer shape, wherein the plurality of semiconductor chips are juxtaposed on a semiconductor chip mounting surface of the substrate, on which mounting surface the plurality of semiconductor chips are mounted; and
a sealing resin that covers the semiconductor chip mounting surface and that completely encapsulates the plurality of semiconductor chips so that the plurality of semiconductor chips are sealed within the resin, wherein a semiconductor chip of the plurality of semiconductor chips which is mounted so as to traverse a center line has a greater thickness in a direction perpendicular to the semiconductor chip mounting surface than a thickness, in the direction, of any of the other semiconductor chips of the plurality of semiconductor chips, said center line being defined by an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface.

24. The semiconductor device as set forth in claim 23, wherein said semiconductor chip of the plurality of semiconductor chips which is mounted so as to traverse the center line has a surface via which said semiconductor chip is mounted on the semiconductor chip mounting surface, which surface has a larger area than an area of any of surfaces via which said the other semiconductor chips are respectively mounted on the semiconductor chip mounting surface.

25. The semiconductor device as set forth in claim 23, wherein the substrate has a thinner thickness in the direction perpendicular to the semiconductor chip mounting surface than the thickness of said semiconductor chip of the plurality of semiconductor chips which is mounted so as to traverse the center line.

26. The semiconductor device as set forth in claim 23, wherein the thickness of said semiconductor chip of the plurality of semiconductor chips which is mounted so as to traverse the center line is thicker than half a thickness of the sealing resin in the direction perpendicular to the semiconductor mounting surface.

27. A semiconductor device comprising an MCM packaging structure, said MCM packaging structure comprising:
at least three semiconductor chip units, wherein each semiconductor chip unit comprises a single semiconductor chip or a plurality of stacked semiconductor chips;
a substrate having a substantially rectangular outer shape, wherein said at least three semiconductor chip units are juxtaposed on a semiconductor chip mounting surface of the substrate, on which mounting surface said at least three semiconductor chip units are mounted; and a sealing resin that covers the semiconductor chip mounting surface and that completely encapsulates the at least three semiconductor chip units so that said at least three semiconductor chip units are sealed within the resin, wherein a semiconductor chip unit of said at least three semiconductor chip units which is mounted so as to traverse a center line has a greater thickness in a direction perpendicular to the semiconductor chip mounting surface than a thickness, in the direction, of any of the other semiconductor chip units of said at least three semiconductor chip units, said center line being defined by an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface.

28. The semiconductor device as set forth in claim 27, wherein the substrate has a thinner thickness in the direction perpendicular to the semiconductor chip mounting surface than the thickness of said semiconductor chip unit of the at least three semiconductor chip units which is mounted so as to traverse the center line.

29. The semiconductor device as set forth in claim 27, wherein the thickness of said semiconductor chip unit of the at least three semiconductor chip units which is mounted so as to traverse the center line is thicker than half a thickness of the sealing resin in the direction perpendicular to the semiconductor chip mounting surface.

30. A semiconductor device comprising an MCM packaging structure, said MCM packaging structure comprising:
a plurality of semiconductor chips;
a circuit substrate having a substantially rectangular outer shape, wherein the plurality of semiconductor chips are juxtaposed on a semiconductor chip mounting surface of the circuit substrate, on which mounting surface the plurality of semiconductor chips are mounted; and
the semiconductor chip mounting surface is covered with a sealing resin along an outer edge of the circuit substrate so that the plurality of semiconductor chips are sealed, wherein a semiconductor chip of the plurality of semiconductor chips which is mounted so as to traverse a center line has a greater thickness in a direction perpendicular to the semiconductor chip mounting surface than a thickness, in the direction, of any of the other semiconductor chips of the plurality of semiconductor chips, said center line being defined by an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface, and wherein the sealing resin seals top surfaces of the other semiconductor chips, the top surfaces being surfaces opposite to surfaces facing the circuit substrate.

31. A semiconductor device comprising an MCM packaging structure, said MCM packaging structure comprising:
at least three semiconductor chips;
a circuit substrate having a substantially rectangular outer shape, wherein said at least three semiconductor chips, each alone or stacked, are juxtaposed on a semiconductor chip mounting surface of the circuit substrate, on which mounting surface said at least three semiconductor chips are mounted; and
wherein the semiconductor chip mounting surface is covered with a sealing resin along an outer edge of the circuit substrate so that said at least three semiconductor chips are sealed, wherein a semiconductor chip of said at least three semiconductor chips which is mounted, alone or stacked, so as to traverse a center line has a greater thickness in a direction perpendicular to the semiconductor chip mounting surface than a thickness, in the direction, of any of the other semiconductor chips of said at least three semiconductor chips, each of which is mounted, alone or stacked, said center line being defined by an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface, and wherein the sealing resin seals top surfaces of the other semiconductor chips, the top surfaces being surfaces opposite to surfaces facing the circuit substrate.

32. A semiconductor device comprising an MCM packaging structure, said MCM packaging structure comprising:
a plurality of semiconductor chips;
a circuit substrate having a substantially rectangular outer shape, wherein the plurality of semiconductor chips, each alone or stacked, are juxtaposed on a semiconductor chip mounting surface of the circuit substrate, on which mounting surface the plurality of semiconductor chips are mounted, and
wherein the semiconductor chip mounting surface is covered with a sealing resin along an outer edge of the circuit substrate so that the plurality of semiconductor chips are sealed, wherein a warpage prevention member is stacked on a semiconductor chip of the plurality of semiconductor chips which is mounted, alone or stacked, so as to traverse a center line, said center line being defined by an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface, and a total thickness, indicative of a sum of a thickness of said semiconductor chip and a thickness of the warpage prevention member each in a direction perpendicular to the semiconductor chip mounting surface, is greater than a thickness, in the direction, of any of the other semiconductor chips of the plurality of semiconductor chips which are mounted, alone or stacked, on the semiconductor chip mounting surface, and wherein the sealing resin seals top surfaces of the other semiconductor chips, the top surfaces being surfaces opposite to surfaces facing the circuit substrate.

33. A semiconductor device comprising an MCM packaging structure, said MCM packaging structure comprising:
a plurality of semiconductor chips;
a substrate for mounting the plurality of semiconductor chips, wherein the plurality of semiconductor chips are juxtaposed on a semiconductor chip mounting surface of the substrate, on which mounting surface the plurality of semiconductor chips are mounted; and wherein the semiconductor chip mounting surface is covered with a sealing resin so that the plurality of semiconductor chips are sealed, wherein a semiconductor chip of the plurality of semiconductor chips which is mounted so as to traverse a center line has a greater thickness in a direction perpendicular to the semiconductor chip mounting surface than a thickness, in the direction, of any of the other semiconductor chips of the plurality of semiconductor chips, said center line being defined by an intersection of (i) a first cross section which divides the semiconductor chip mounting surface into two in a horizontal direction of the semiconductor chip mounting surface and (ii) a second cross section which divides the semiconductor chip mounting surface into two in a vertical direction of the semiconductor chip mounting surface, and wherein the sealing resin seals top surfaces of the other semiconductor chips, the top surfaces being surfaces opposite to surfaces facing the circuit substrate.

34. A semiconductor device comprising an MCM packaging structure, said MCM packaging structure comprising:
   at least three semiconductor chips;
   a substrate for mounting the at least three semiconductor chips, wherein said at least three semiconductor chips, each alone or stacked, are juxtaposed on a semiconductor chip mounting surface of the substrate, on which mounting surface said at least three semiconductor chips are mounted; and
   wherein the semiconductor chip mounting surface is covered with a sealing resin so that said at least three semiconductor chips are sealed, wherein a semiconductor chip of said at least three semiconductor chips which is mounted so as to traverse a center line has a greater thickness in a direction perpendicular to the semiconductor chip mounting surface than a thickness, in the direction, of any of the other semiconductor chips of said at least three semiconductor chips, each of which is mounted, alone or stacked, said center line being defined by an intersection of (i) a first cross section which divides the semiconductor chip mounting surface into two in a horizontal direction of the semiconductor chip mounting surface and (ii) a second cross section which divides the semiconductor chip mounting surface into two in a vertical direction of the semiconductor chip mounting surface, and wherein the sealing resin seals top surfaces of the other semiconductor chips, the top surfaces being surfaces opposite to surfaces facing the circuit substrate.

35. A semiconductor device comprising an MCM packaging structure, said MCM packaging structure comprising:
   a plurality of semiconductor chips;
   a substrate having a substantially rectangular outer shape, wherein the plurality of semiconductor chips are juxtaposed on a semiconductor chip mounting surface of the substrate, on which mounting surface the plurality of semiconductor chips are mounted; and
   wherein the semiconductor chip mounting surface is covered with a sealing resin so that the plurality of semiconductor chips are sealed, wherein a semiconductor chip of the plurality of semiconductor chips which is mounted so as to traverse a center line has a greater thickness in a direction perpendicular to the semiconductor chip mounting surface than a thickness, in the direction, of any of the other semiconductor chips of the plurality of semiconductor chips, said center line being defined by an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface, and wherein the sealing resin seals top surfaces of the other semiconductor chips, the top surfaces being surfaces opposite to surfaces facing the circuit substrate.

36. A semiconductor device comprising an MCM packaging structure, said MCM packaging structure comprising:
   at least three semiconductor chips;
   a substrate having a substantially rectangular outer shape, wherein said at least three semiconductor chips, each alone or stacked, are juxtaposed on a semiconductor chip mounting surface of the substrate, on which mounting surface said at least three semiconductor chips are mounted; and
   wherein the semiconductor chip mounting surface is covered with a sealing resin so that said at least three semiconductor chips are sealed, wherein a semiconductor chip of said at least three semiconductor chips which is mounted, alone or stacked, so as to traverse a center line has a greater thickness in a direction perpendicular to the semiconductor chip mounting surface than a thickness, in the direction, of any of the other semiconductor chips of said at least three semiconductor chips, each of which is mounted, alone or stacked, said center line being defined by an intersection of (i) a longitudinal cross section which divides the semiconductor chip mounting surface into two in a longitudinal direction of the semiconductor chip mounting surface and (ii) a transverse cross section which divides the semiconductor chip mounting surface into two in a transverse direction of the semiconductor chip mounting surface, and wherein the sealing resin seals top surfaces of the other semiconductor chips, the top surfaces being surfaces opposite to surfaces facing the circuit substrate.

* * * * *